(12) United States Patent
Machida

(10) Patent No.: US 12,498,180 B2
(45) Date of Patent: Dec. 16, 2025

(54) HEAT PIPE

(71) Applicant: SHINKO ELECTRIC INDUSTRIES CO., LTD., Nagano (JP)

(72) Inventor: Yoshihiro Machida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 240 days.

(21) Appl. No.: 18/307,330

(22) Filed: Apr. 26, 2023

(65) Prior Publication Data

US 2023/0366633 A1  Nov. 16, 2023

(30) Foreign Application Priority Data

May 12, 2022 (JP) ................................ 2022-078851

(51) Int. Cl.
*F28D 15/02* (2006.01)
*H05K 7/20* (2006.01)

(52) U.S. Cl.
CPC ..... *F28D 15/0283* (2013.01); *F28D 15/0233* (2013.01); *F28D 15/0266* (2013.01); *H05K 7/20336* (2013.01)

(58) Field of Classification Search
CPC ............ F28D 15/0266; F28D 15/0283; H05K 7/20336
See application file for complete search history.

(56) References Cited

U.S. PATENT DOCUMENTS

| | | | |
|---|---|---|---|
| 2009/0025910 A1* | 1/2009 | Hoffman | F28D 15/046 165/104.21 |
| 2016/0259383 A1 | 9/2016 | Shioga et al. | |
| 2018/0306521 A1* | 10/2018 | Machida | F28D 15/0266 |
| 2019/0128618 A1* | 5/2019 | Machida | B23P 15/26 |
| 2019/0128620 A1* | 5/2019 | Machida | F28D 15/046 |
| 2019/0162481 A1* | 5/2019 | Machida | F28D 15/0266 |
| 2019/0204017 A1* | 7/2019 | Kiso | F28D 15/0266 |
| 2019/0234692 A1* | 8/2019 | Kiso | F28D 15/043 |

(Continued)

FOREIGN PATENT DOCUMENTS

| | | |
|---|---|---|
| EP | 3392594 A2 | 10/2018 |
| EP | 3477236 A1 | 5/2019 |

(Continued)

OTHER PUBLICATIONS

European Search Report corresponding to Application No. 23165581.2 dated Sep. 25, 2023, 5 pages.

(Continued)

*Primary Examiner* — Paul Alvare

(74) *Attorney, Agent, or Firm* — Rankin, Hill & Clark LLP

(57) ABSTRACT

The heat pipe includes an injection port into which a working fluid is injected. The injection port has a first outer metal layer, a second outer metal layer, at least one inner metal layer provided between the first outer metal layer and the second outer metal layer, and an injection passage in which the injected working fluid moves, the injection passage demarcated by the first outer metal layer, the second outer metal layer, and the inner metal layer. The first outer metal layer has a first inner surface facing the second outer metal layer and constituting a first inner surface of the injection passage. The first inner surface of the first outer metal layer has at least one first groove portion.

6 Claims, 19 Drawing Sheets

(56) References Cited

U.S. PATENT DOCUMENTS

| | | | |
|---|---|---|---|
| 2020/0018556 A1* | 1/2020 | Machida | F28D 15/04 |
| 2020/0049417 A1* | 2/2020 | Machida | F28D 15/046 |
| 2020/0049419 A1 | 2/2020 | Machida | |
| 2020/0124353 A1* | 4/2020 | Machida | H01L 23/427 |
| 2021/0232189 A1 | 7/2021 | Shioga et al. | |

FOREIGN PATENT DOCUMENTS

| | | |
|---|---|---|
| EP | 3492856 A1 | 6/2019 |
| JP | 03-046767 U | 4/1991 |
| JP | 2004-309002 A | 11/2004 |
| JP | 6146484 B2 | 6/2017 |
| JP | 2019-074254 A | 5/2019 |
| JP | 2020-026930 A | 2/2020 |

OTHER PUBLICATIONS

Japanese Office Action dated Jul. 29, 2025, issued in corresponding Japanese Application No. 2022-078851; English translation included; 6 pages.

\* cited by examiner

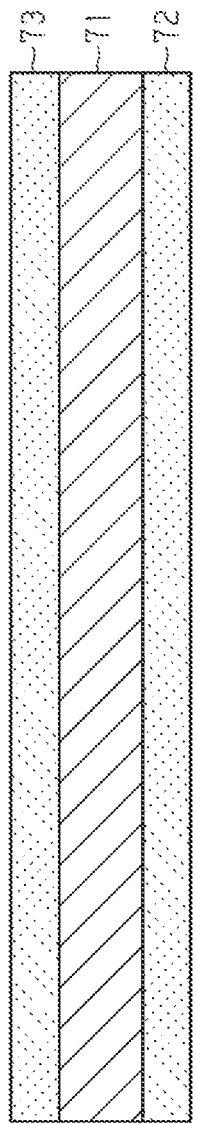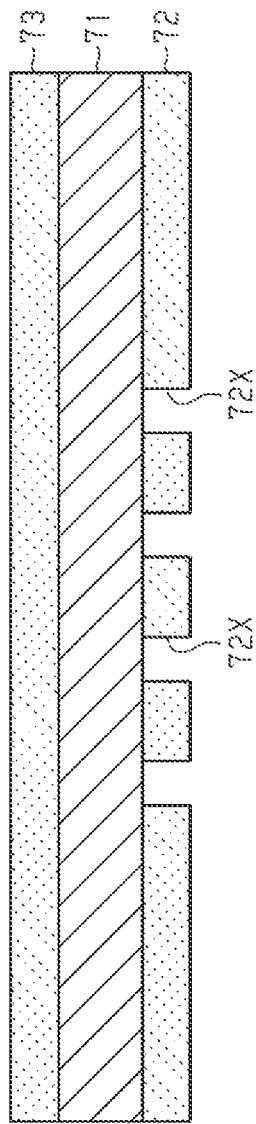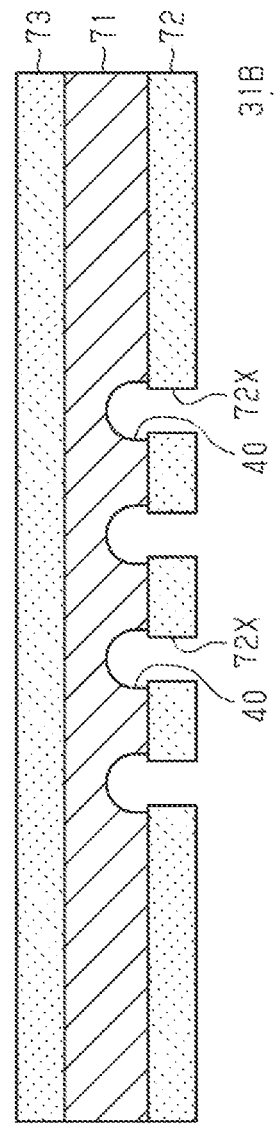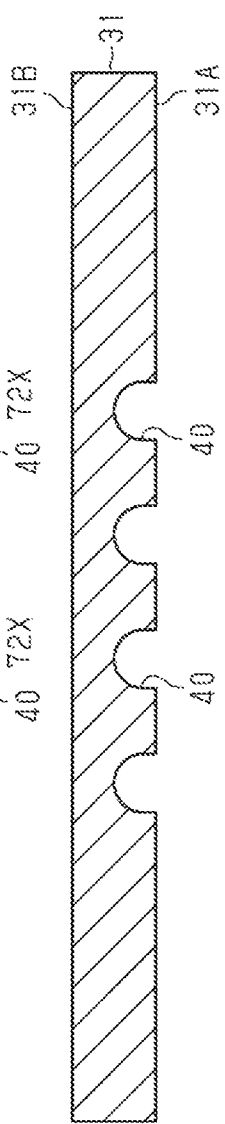

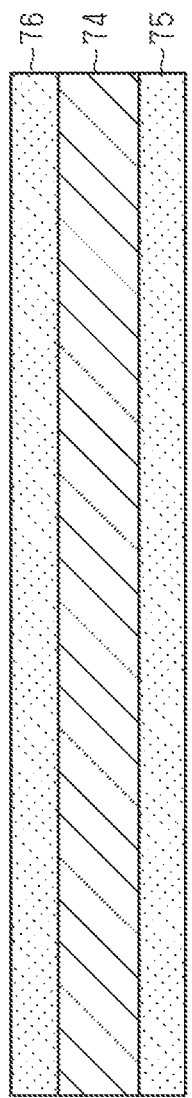
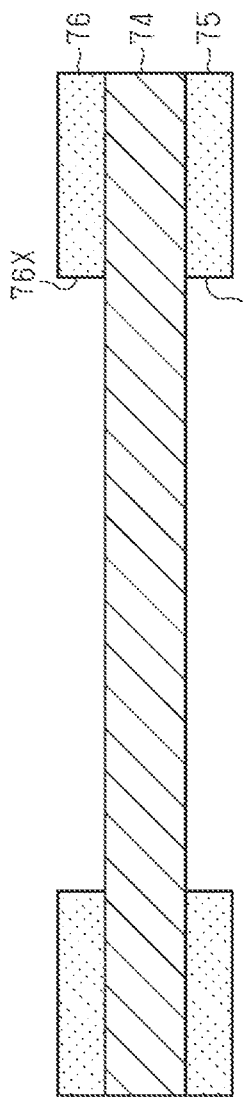
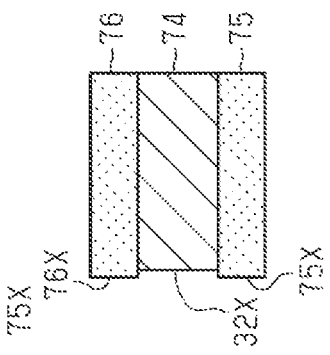
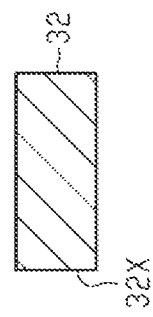
FIG. 7A
FIG. 7B
FIG. 7C
FIG. 7D

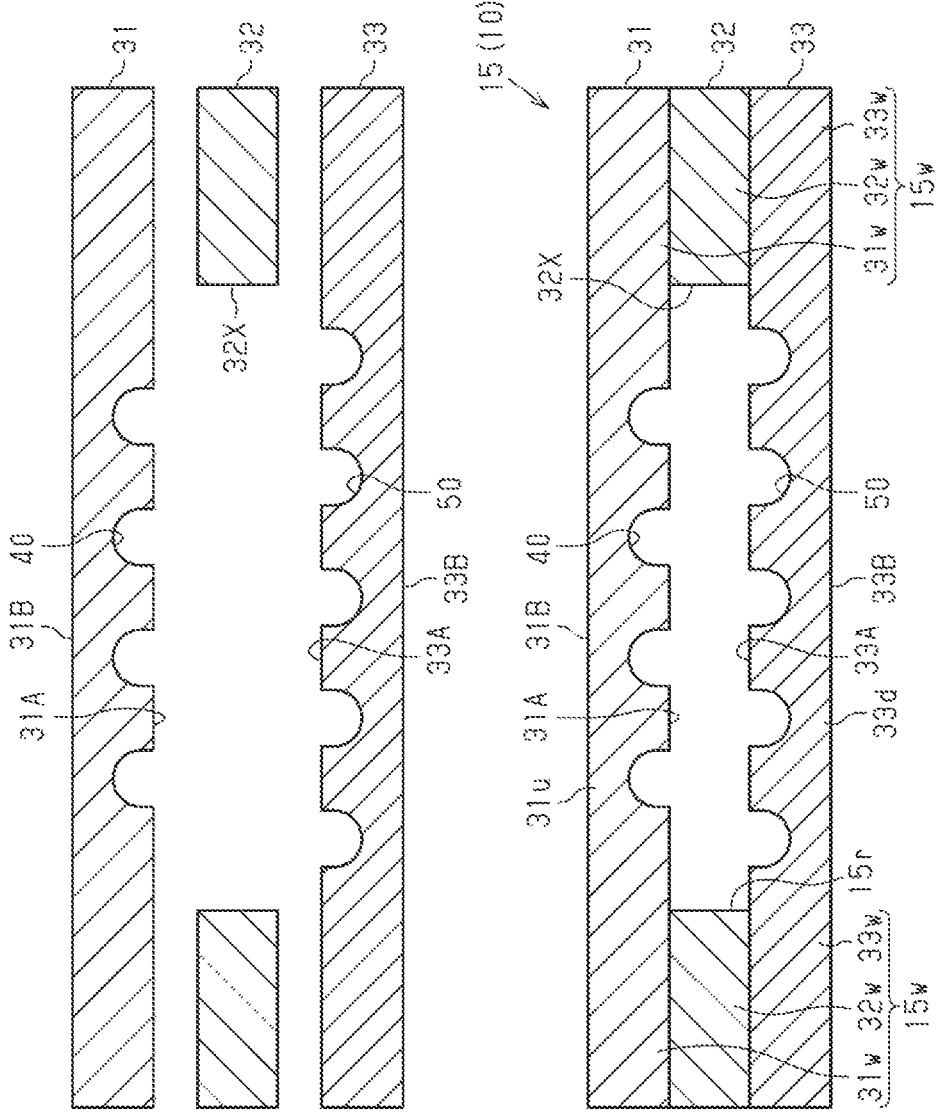

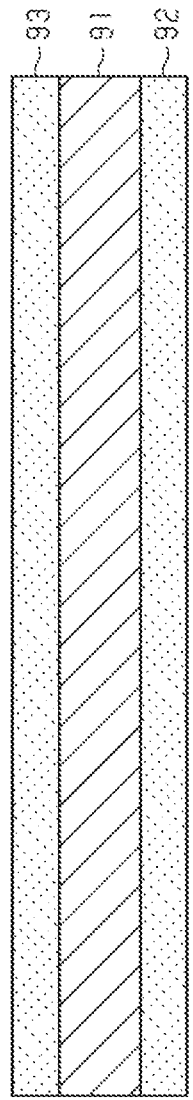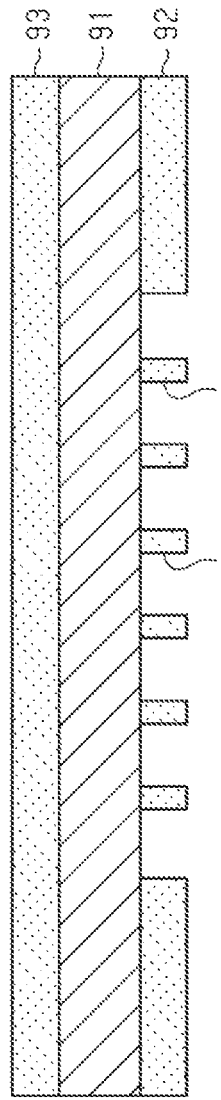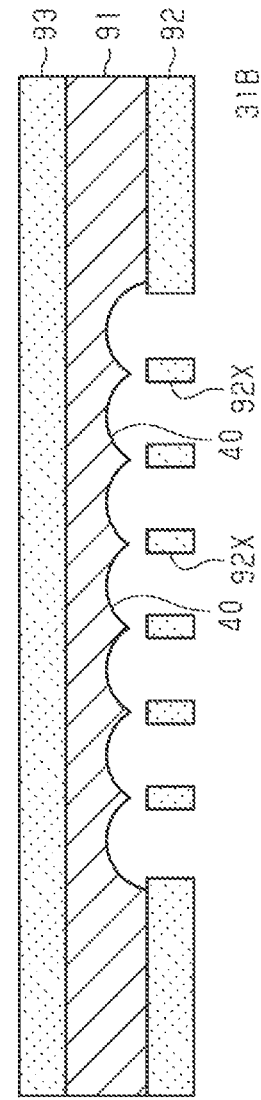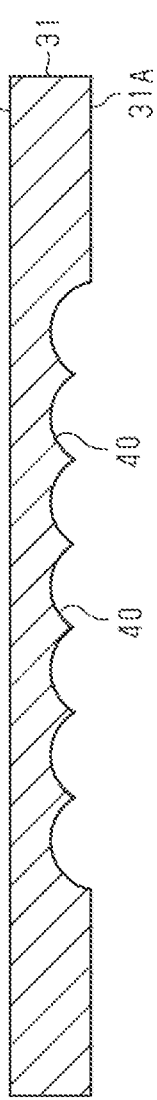
FIG. 18A
FIG. 18B
FIG. 18C
FIG. 18D

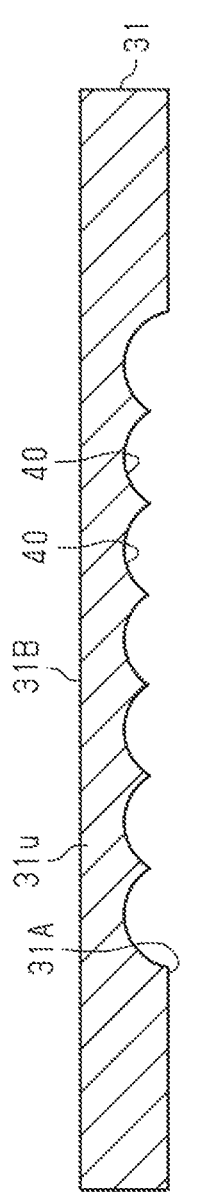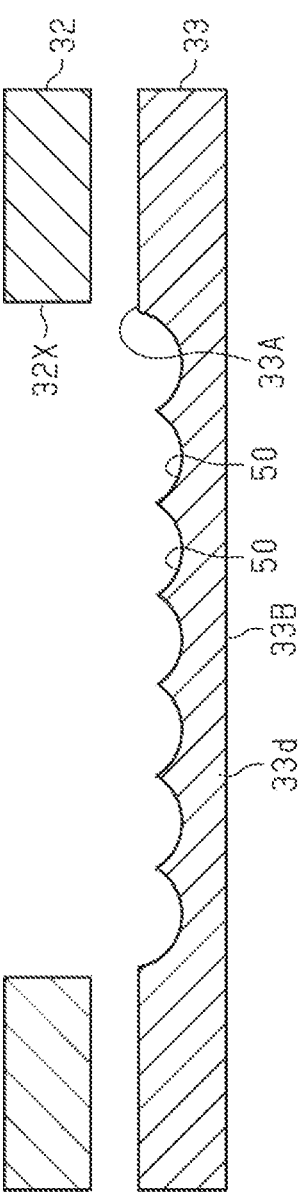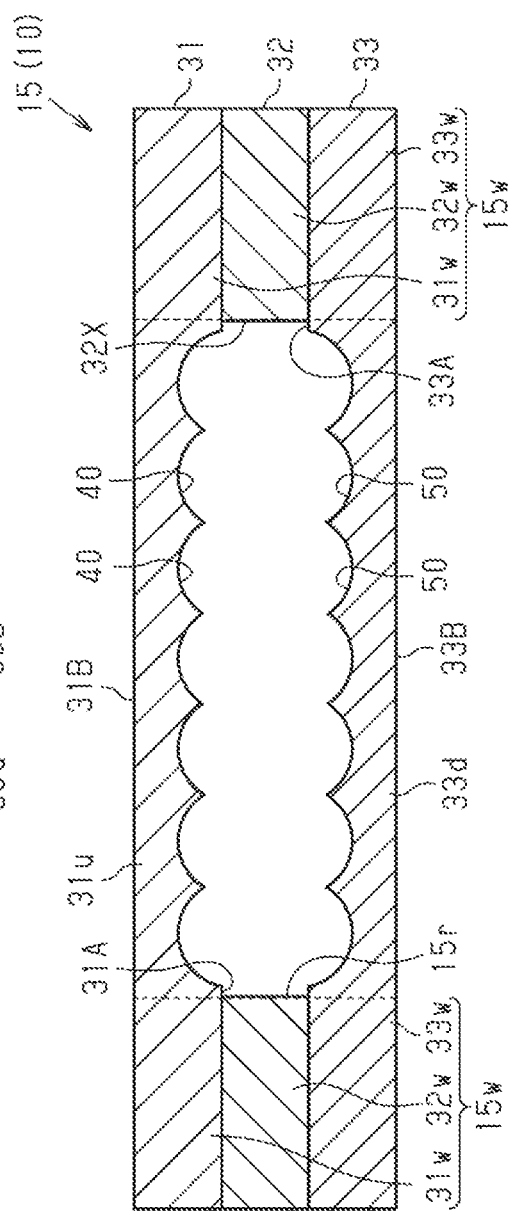
FIG. 19A
FIG. 19B

HEAT PIPE

CROSS-REFERENCE TO RELATED APPLICATIONS

This application claims priority from Japanese Patent Application No. 2022-078851 filed on May 12, 2022, the contents of which are incorporated herein by reference.

TECHNICAL FIELD

The present invention relates to a heat pipe.

BACKGROUND ART

In the related art, as a device configured to cool a heat-generating component of a semiconductor device (for example, a CPU or the like) mounted on an electronic device, suggested is a heat pipe configured to transport heat by using a phase change of a working fluid (for example, refer to JP 6,146,484B). The working fluid is injected into the heat pipe through an injection port provided to the heat pipe. Thereafter, the injection port is sealed.

SUMMARY OF INVENTION

Electronic devices, such as portable devices, are progressing in thinning. Along with the thinning of the electronic devices, thinning of heat pipes is also required. When the heat pipe is made thin, the injection port becomes small, making it difficult to inject the working fluid. For this reason, improvement in the injectability of the working fluid is required.

Certain embodiment provides a heat pipe. The heat pipe comprises an injection port into which a working fluid is injected. The injection port has a first outer metal layer, a second outer metal layer, at least one inner metal layer provided between the first outer metal layer and the second outer metal layer, and an injection passage in which the injected working fluid moves, the injection passage demarcated by the first outer metal layer, the second outer metal layer, and the inner metal layer. The first outer metal layer has a first inner surface facing the second outer metal layer and constituting a first inner surface of the injection passage. The first inner surface of the first outer metal layer has at least one first groove portion.

According to one aspect of the present invention, it is possible to obtain an effect capable of easily injecting the working fluid.

BRIEF DESCRIPTION OF DRAWINGS

FIG. 6A to 6D are schematic sectional views showing a manufacturing method of a loop-type heat pipe of one embodiment.

FIG. 7A to 7D are schematic sectional views showing the manufacturing method of a loop-type heat pipe of one embodiment.

FIGS. 8A and 8B are schematic sectional views showing the manufacturing method of a loop-type heat pipe of one embodiment.

FIGS. 18A to 18D are schematic sectional views showing a manufacturing method of a loop-type heat pipe of a modified embodiment.

FIGS. 19A and 19B are schematic sectional views showing the manufacturing method of a loop-type heat pipe of the modified embodiment.

DESCRIPTION OF EMBODIMENTS

Hereinafter, one embodiment will be described with reference to the accompanying drawings.

Note that, for convenience's sake, in the accompanying drawings, a characteristic part is enlarged so as to easily understand the feature, and the dimension ratios of the respective constitutional elements may be different in the respective drawings. Further, in the sectional views, hatching of some members is shown in a satin form and hatching of some members is omitted, so as to easily understand a sectional structure of each member. In the respective drawings, an X-axis, a Y-axis, and a Z-axis orthogonal to one another are shown. In descriptions below, for convenience's sake, a direction extending along the X-axis is referred to as 'X-axis direction', a direction extending along the Y-axis is referred to as 'Y-axis direction', and a direction extending along the Z-axis is referred to as 'Z-axis direction'. Note that, in the present specification, 'in a plan view' means seeing a target object in the Z-axis direction, and 'planar shape' means a shape of a target object as seen in the Z-axis direction. In addition, in the present specification, 'facing' indicates that surfaces or members are in front of each other, and includes not only a case in which they are completely in front of each other, but also a case in which they are partially in front of each other. In the present specification, 'facing' includes not only a case in which two members are apart from each other, but also a case in which two members are in contact with each other.

(Overall Configuration of Loop-Type Heat Pipe 10)

Figure 1:
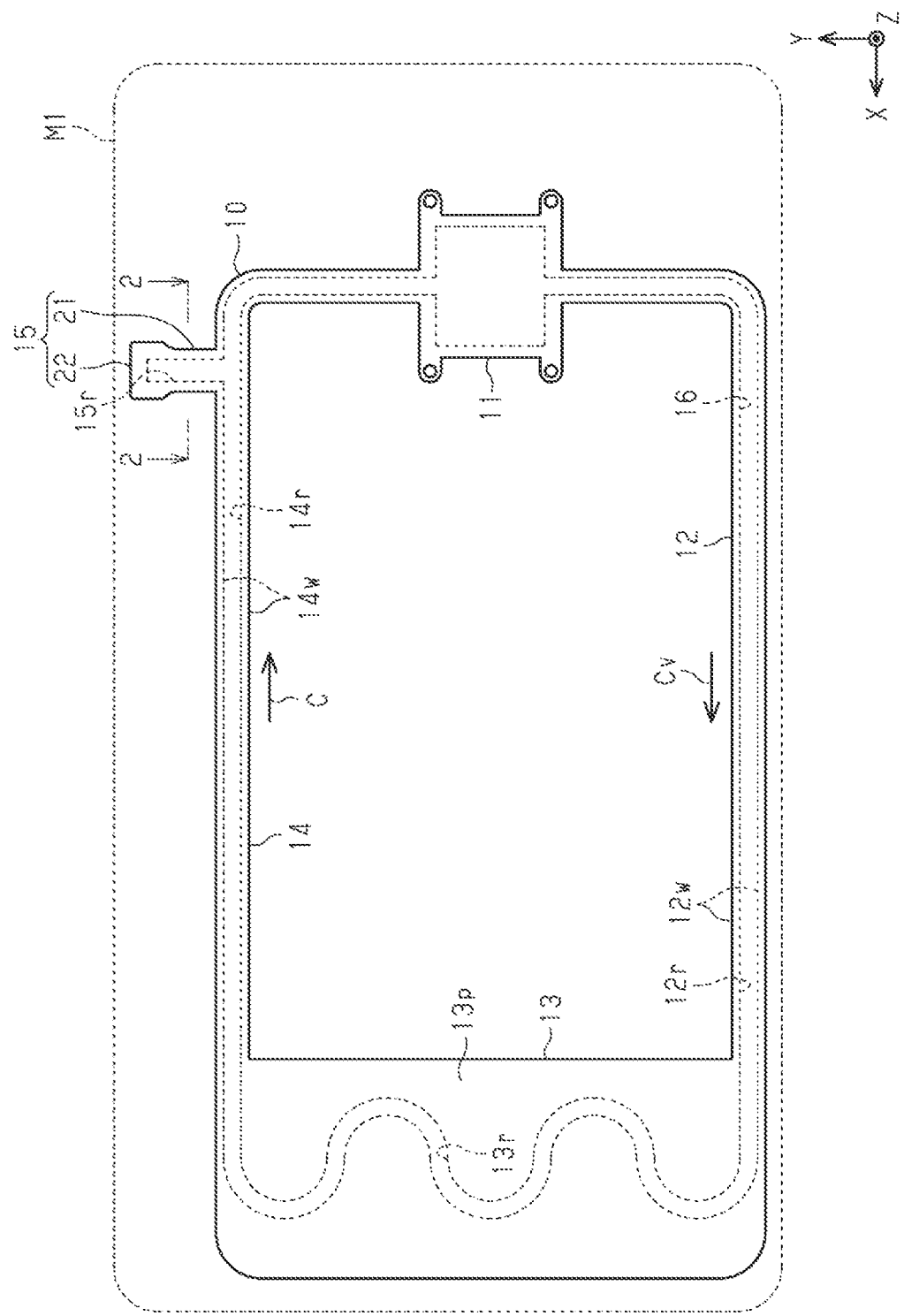
FIG. 1 is a schematic plan view showing a loop-type heat pipe of one embodiment.

A loop-type heat pipe 10 shown in FIG. 1 is accommodated in a mobile electronic device M1 such as a smart phone and a tablet terminal, for example. The loop-type heat pipe 10 has an evaporator 11, a vapor pipe 12, a condenser 13, a liquid pipe 14 and an injection port 15.

The evaporator 11 and the condenser 13 are connected by the vapor pipe 12 and the liquid pipe 14. The evaporator 11 has a function of vaporizing a working fluid C to generate vapor Cv. The vapor Cv generated in the evaporator 11 is sent to the condenser 13 via the vapor pipe 12. The condenser 13 has a function of condensing the vapor Cv of the working fluid C. The condensed working fluid C is sent to the evaporator 11 via the liquid pipe 14. The vapor pipe 12 and the liquid pipe 14 are configured to form a loop-shaped flow passage 16 through which the working fluid C or the vapor Cv is caused to flow.

The vapor pipe 12 is formed, for example, by a long-length pipe body. The liquid pipe 14 is formed, for example, by a long-length pipe body. In the present embodiment, the vapor pipe 12 and the liquid pipe 14 are the same in dimension (i.e., length) in a length direction, for example. Note that the length of the vapor pipe 12 and the length of the liquid pipe 14 may be different from each other. For example, the length of the vapor pipe 12 may be shorter than the length of the liquid pipe 14. Here, in the present specification, the 'length direction' of the evaporator 11, the vapor pipe 12, the condenser 13 and the liquid pipe 14 is a direction that coincides with a direction (refer to an arrow in the drawing) in which the working fluid C or vapor Cv flows in each member. In addition, in the present specification, the 'same' includes not only a case in which comparison targets are exactly the same but also a case in which there is a slight difference between the comparison targets due to influences of dimensional tolerances and the like.

The evaporator 11 is in close contact with and fixed to a heat-generating component (not shown). The working fluid C in the evaporator 11 is vaporized by heat generated by the heat-generating component, and vapor Cv is accordingly generated. Note that a thermal conduction member (TIM: Thermal Interface Material) may also be interposed between the evaporator 11 and the heat-generating component. The thermal conduction member is configured to reduce a contact thermal resistance between the heat-generating component and the evaporator 11 and to smooth heat conduction from the heat-generating component to the evaporator 11.

The vapor pipe 12 has a pair of pipe walls 12w provided on both sides in a width direction orthogonal to the length direction of the vapor pipe 12, in a plan view, and a flow passage 12r provided between the pair of pipe walls 12w, for example. The flow passage 12r is formed to communicate with an internal space of the evaporator 11. The flow passage 12r is a part of the loop-shaped flow passage 16. The vapor Cv generated in the evaporator 11 is introduced into the condenser 13 via the vapor pipe 12.

The condenser 13 has a heat radiation plate 13p whose area is increased for heat radiation, and a serpentine flow passage 13r in the heat radiation plate 13p, for example. The flow passage 13r is a part of the loop-shaped flow passage 16. The vapor Cv introduced via the vapor pipe 12 is condensed in the condenser 33.

The liquid pipe 14 has a pair of pipe walls 14w provided on both sides in the width direction orthogonal to the length direction of the liquid pipe 14, in a plan view, and a flow passage 14r provided between the pair of pipe walls 14w, for example. The flow passage 14r is formed to communicate with the flow passage 13r of the condenser 13 and the internal space of the evaporator 11. The flow passage 14r is a part of the loop-shaped flow passage 16. The working fluid C condensed in the condenser 13 is guided to the evaporator 11 through the liquid pipe 14.

In the loop-type heat pipe 10, the heat generated by the heat-generating component is transferred to the condenser 13 and radiated in the condenser 13. Thereby, the heat-generating component is cooled, and the temperature rise of the heat-generating component is suppressed.

Here, as the working fluid C, a fluid having a high vapor pressure and a high latent heat of vaporization is preferably used. By using such working fluid C, it is possible to effectively cool the heat-generating component by the latent heat of vaporization. As the working fluid C, ammonia, water, freon, alcohol, acetone and the like can be used, for example.

(Configuration of Injection Port 15)

The injection port 15 is an inlet for injecting the working fluid C into the loop-type heat pipe 10. That is, the injection port 15 is an inlet for injecting the working fluid C into the flow passage 16. The injection port 15 has, for example, a length direction extending along the Y-axis direction, a width direction extending along the X-axis direction, and a thickness direction extending along the Z-axis direction. In the injection port 15 of the present embodiment, one end portion in the length direction of the injection port 15 is connected to the liquid pipe 14. Through the injection port 15 of the present embodiment, the working fluid C is injected into the liquid pipe 14. Note that the injection port 15 may also be connected to the evaporator 11, the vapor pipe 12 and the condenser 13. In this case, the working fluid C injected into the flow passage 16 moves into the liquid pipe 14 from the injection site.

The injection port 15 is airtightly sealed after the injection of the working fluid C. The injection port 15 after sealing has, for example, an unsealed part 21 connected to the liquid pipe 14 and a sealed part 22 connected to the unsealed part 21. In the loop-type heat pipe 10, for example, the liquid pipe 14, the unsealed part 21, and the sealed part 22 are continuously formed integrally with each other.

The unsealed part 21 generally maintains a shape before sealing, i.e., a shape at a time when the working fluid C is injected into the liquid pipe 14, for example. The sealed part 22 has, for example, a shape similar to that of the unsealed part 21 at the time when the working fluid C is injected into the liquid pipe 14, and is crushed and flattened after the working fluid C is injected into the liquid pipe 14. By flattening the sealed part 22, it is possible to airtightly seal the injection port so that the working fluid C injected into the liquid pipe 14 does not leak to an outside.

Figure 2:
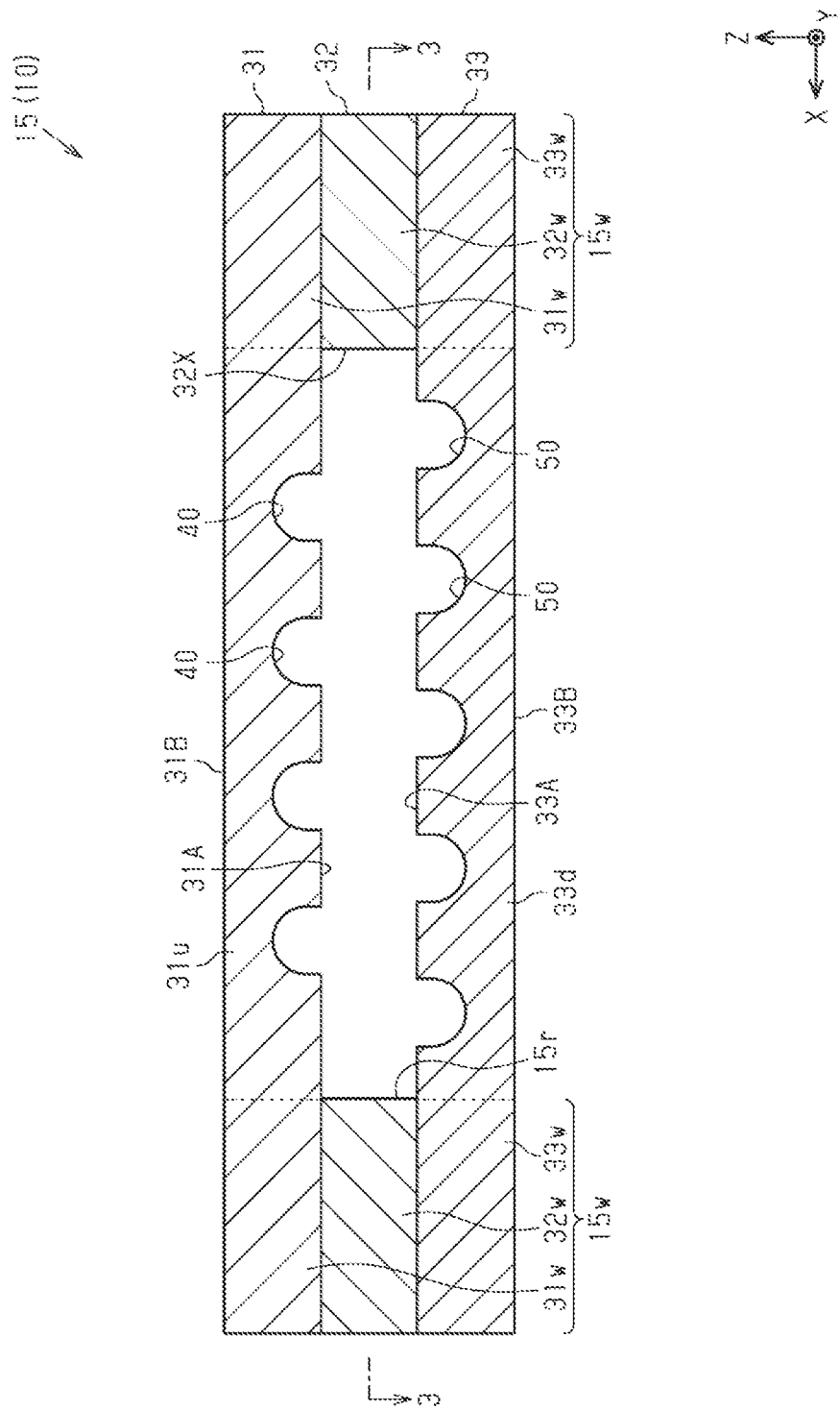
FIG. 2 is a schematic cross section showing an injection port of one embodiment.
Figure 3:
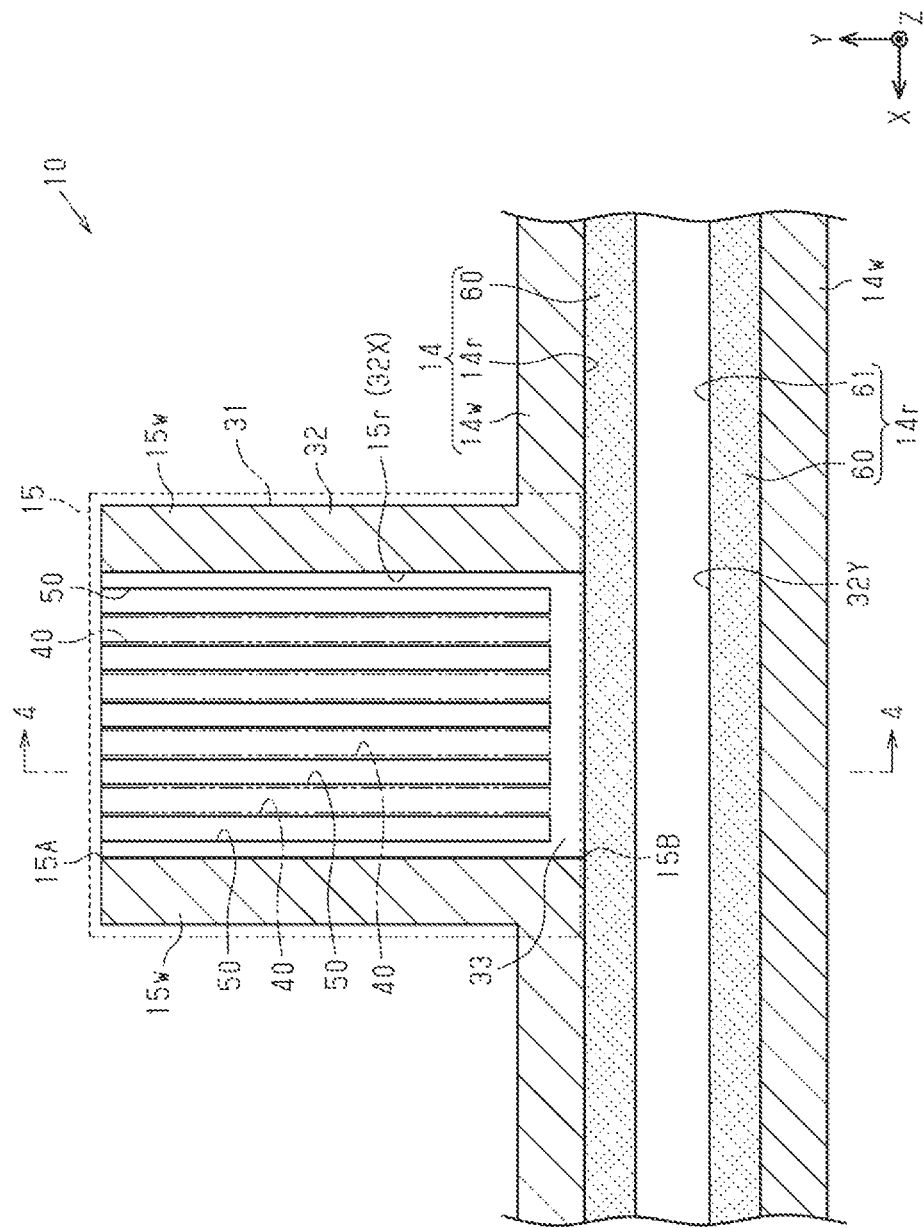
FIG. 3 is a schematic sectional view showing the loop-type heat pipe of one embodiment.
Figure 4:
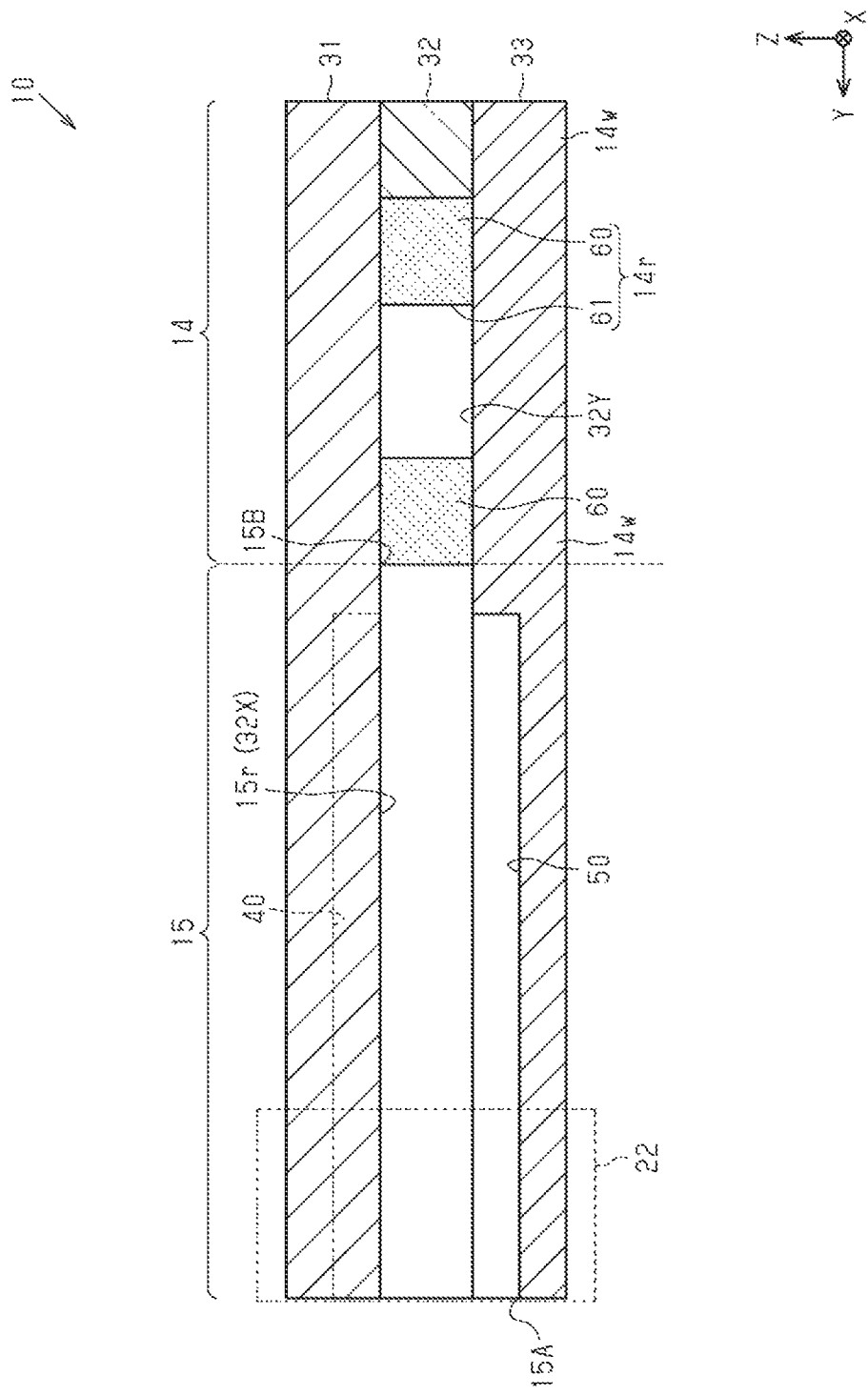
FIG. 4 is a schematic sectional view showing the loop-type heat pipe of one embodiment.

FIGS. 2 to 4 show the injection port 15 before sealing, i.e., the injection port 15 in an unsealed state. FIG. 2 shows a section of the injection port 15 at a position corresponding to a line 2-2 of FIG. 1. The section shown in FIG. 2 is a section obtained by cutting the injection port 15 along an XZ plane orthogonal to the length direction (here, the Y-axis direction) of the injection port 15. FIG. 3 shows a section of the injection port 15 and the liquid pipe 14 at a position corresponding to a line 3-3 of FIG. 2. FIG. 4 shows a section of the injection port 15 and the liquid pipe 15 at a position corresponding to a line 4-4 of FIG. 3.

As shown in FIGS. 2 and 3, the injection port 15 has an injection passage 15r through which the working fluid C moves therein, and a pair of pipe walls 15w provided on both sides of the injection passage 15r in the width direction of the injection port 15. As shown in FIGS. 3 and 4, the injection passage 15r extends along the Y-axis direction, for example. The injection passage 15r has a first opening end 15A and a second opening end 15B provided at both end portions of the injection passage 15r in the length direction (here, the Y-axis direction). The first open end 15A is connected to an outside of the loop-type heat pipe 10, for example. The first opening end 15A of the present embodiment is a part that becomes the sealed part 22 (refer to FIG. 1) after injection of the working fluid C. The second opening end 15B is connected to the flow passage 14r of the liquid pipe 14, for example. The injection passage 15r is formed to communicate the outside of the loop-type heat pipe 10 and the flow passage 14r of the liquid pipe 14 each other. The working fluid C is injected into the liquid pipe 14 through the injection passage 15r.

As shown in FIG. 2, the injection port 15 has a structure in which three metal layers 31, 32 and 33 are stacked, for example. In other words, the injection port 15 has a structure in which the metal 32, which is an inner metal layer, is stacked between the metal layers 31 and 33, which are a pair of outer metal layers. The inner metal layer of the injection port 15 of the present embodiment is configured by only one metal layer 32.

Each of the metal layers 31 to 33 is a copper (Cu) layer having excellent thermal conductivity. The plurality of metal layers 31 to 33 are directly joined to each other by solid-phase bonding such as diffusion joining, pressure welding, friction pressure welding and ultrasonic joining. Note that, in FIG. 2, the metal layers 31 to 33 are identified by solid lines for easy understanding. For example, when the metal layers 31 to 33 are integrated by diffusion joining, interfaces of the respective metal layers 31 to 33 may be lost and boundaries may not be clear, in some cases. As used herein, the solid-phase bonding is a method of heating and softening bonding target objects in a solid-phase (solid) state without melting the same, and then further heating, plastically deforming and bonding the bonding target objects. Note that the metal layers 31 to 33 are not limited to the copper layers and may also be formed of stainless steel, aluminum, magnesium alloy or the like. In addition, for some of the stacked metal layers 31 to 33, a material different from the other metal layers may also be used. A thickness of each of the metal layers 31 to 33 may be set to about 50 μm to 200 μm, for example. Note that, some of the metal layers 31 to 33 may be formed to have a thickness different from the other metal layers, and all the metal layers may be formed to have thicknesses different from each other.

(Configuration of Metal Layer 32)

The metal layer 32 is stacked between the metal layer 31 and the metal layer 33. An upper surface of the metal layer 32 is joined to the metal layer 31. A lower surface of the metal layer 32 is joined to the metal layer 33. The metal layer 32 has a through-hole 32X penetrating through the metal layer 32 in the thickness direction, and a pair of wall portions 32w provided on both sides of the through-hole 32X in the width direction of the injection port 15. The through-hole 32X constitutes the injection passage 15r.

(Configuration of Metal Layer 31)

The metal layer 31 is stacked on an upper surface of the metal layer 32. The metal layer 31 has an inner surface 31A (here, lower surface) facing the metal layer 33, and an outer surface 31B (here, upper surface) provided on an opposite side to the inner surface 31A in the thickness direction (here, Z-axis direction) of the metal layer 31. The metal layer 31 has wall portions 31w provided at positions overlapping the wall portions 32w in a plan view, and an upper wall 31u provided at a position overlapping the injection passage 15r in a plan view. The inner surface 31A of the wall portion 31w is joined to an upper surface of the wall portion 32w. The upper wall 31u is provided between the pair of wall portions 31w. The inner surface 31A of the upper wall 31u is exposed to the injection passage 15r. In other words, the inner surface 31A of the upper wall 31u constitutes the inner surface of the injection passage 15r.

The metal layer 31 has one or more groove portions 40 provided in the inner surface 31A. The metal layer 31 of the present example has the four groove portions 40. Each groove portion 40 is formed to communicate with the injection passage 15r. Each groove portion 40 is provided to overlap the injection passage 15r in a plan view. Each groove portion 40 is provided, for example, in the inner surface 31A of the upper wall 31u, i.e., in the inner surface 31A of the part constituting the inner surface of the injection passage 15r. Each groove portion 40 of the present embodiment is provided only in the inner surface 31A of the upper wall 31u of the inner surface 31A of the metal layer 31. In other words, each groove portion 40 of the present embodiment is not provided in the inner surface 31A of the wall portion 31w. Each groove portion 40 is formed to be concave from the inner surface 31A of the metal layer 31 to a middle portion of the metal layer 31 in the thickness direction, for example. Each groove portion 40 is formed to extend from the inner surface 31A of the metal layer 31 to the middle portion of the metal layer 31 in the thickness direction, for example. A depth of each groove portion 40 may be set to about 25 μm to 100 μm, for example. A width dimension of each groove portion 40 along the X-axis direction is formed sufficiently smaller than a width dimension of the injection passage 15r along the X-axis direction. The width dimension of each groove portion 40 may be set to about 25 μm to 100 μm, for example. In this way, the inner surface 31A of the part constituting the inner surface of the injection passage 15r is provided with the plurality of narrow groove portions 40.

A cross-sectional shape of an inner surface of each the groove portion 40 can be formed in an arbitrary shape. A bottom surface of each groove portion 40 is formed, for example, in a curved surface curved in an arc shape. An inner surface of each groove portion 40 is formed to extend perpendicularly to the inner surface 31A of the metal layer 31, for example.

The plurality of groove portions 40 are provided aligned along one direction (here, X-axis direction) of a plane direction orthogonal to the thickness direction of the metal 31. The plurality of groove portions 40 are provided spaced at predetermined intervals in the X-axis direction, for example.

As shown in FIG. 3, each groove portion 40 extends along the length direction of the injection port 15, for example. Each groove portion 40 extends along one direction of the plane direction orthogonal to the thickness direction of the metal layer 31, for example. Each groove portion 40 extends along a direction (here, the Y-axis direction) orthogonal to the direction (here, the X-axis direction) in which the plurality of groove portions 40 are aligned. Each groove portion 40 extends in a direction corresponding to the moving direction of the working fluid C, for example. The plurality of groove portions 40 are formed to extend in parallel to each other, for example.

Each groove portion 40 extends towards the liquid pipe 14, for example. Each groove portion 40 extends from the first opening end 15A of the injection passage 15r toward the liquid pipe 14, for example. Each groove portion 40 extends from the first opening end 15A to the middle of the injection passage 15r in the length direction, for example. In other words, each groove portion 40 does not extend to the second opening end 15B in the length direction of the injection passage 15r. That is, each groove portion 40 does not extend to the flow passage 14r of the liquid pipe 14. Each groove portion 40 is not connected to the flow passage 14r, for example. Each groove portion 40 is formed not to communicate directly with the flow passage 14r, for example. Each groove portion 40 extends to a position overlapping a part of the pipe wall 14w of the liquid pipe 14 in the X-axis direction of the length direction of the injection passage 15r, for example.

(Configuration of Metal Layer 33)

As shown in FIG. 2, the metal layer 33 is stacked on a lower surface of the metal layer 32. The metal layer 33 has an inner surface 33A (here, upper surface) facing the metal layer 31 and an outer surface 33B (here, lower surface) provided on an opposite side to the inner surface 33A in the thickness direction of the metal layer 33. The metal layer 33 has wall portions 33w provided at positions overlapping the wall portions 32w in a plan view, and a lower wall 31d provided at a position overlapping the injection passage 15r in a plan view. The inner surface 33A of the wall portion 33w is joined to the lower surface of the wall portion 32w. The lower wall 33d is provided between the pair of wall portions 33w. The inner surface 33A of the lower wall 33d is exposed to the injection passage 15r. In other words, the inner surface 33A of the lower wall 33d constitutes the inner surface of the injection passage 15r.

The metal layer 33 has one or more groove portions 50 provided in the inner surface 33A. The metal layer 33 of the present embodiment has the five groove portions 50. Each groove portion 50 is formed to communicate with the injection passage 15r. Each groove portion 50 is provided, for example, in the inner surface 33A of the lower wall 33d, i.e., in the inner surface 33A of the part constituting the inner surface of the injection passage 15r. Each groove portion 50 of the present embodiment is provided only in the inner surface 33A of the lower wall 33d of the inner surface 33A of the metal layer 33. In other words, each groove portion 50 of the present embodiment is not provided in the inner surface 33A of the wall portion 33w. Each groove portion 50 is formed to be concave from the inner surface 33A of the metal layer 33 to a middle portion of the metal layer 33 in the thickness direction, for example. Each groove portion 50 is formed to extend from the inner surface 33A of the metal layer 33 to the middle portion of the metal layer 33 in the thickness direction, for example. A depth of each groove portion 50 may be set to about 25 μm to 100 μm, for example. A width dimension of each groove portion 50 along the X-axis direction is formed sufficiently smaller than a width dimension of the injection passage 15r along the X-axis direction. The width dimension of each groove portion 50 along the X-axis direction is the same as the width dimension of each groove portion 40 along the X-axis direction, for example. The width dimension of each groove portion 50 may be set to about 25 μm to 100 μm, for example. In this way, the inner surface 33A of the part constituting the inner surface of the injection passage 15r is provided with the plurality of narrow groove portions 50.

A cross-sectional shape of an inner surface of each the groove portion 50 can be formed in an arbitrary shape. A bottom surface of each groove portion 50 is formed, for example, in a curved surface curved in an arc shape. An inner surface of each groove portion 50 is formed to extend perpendicularly to the inner surface 33A of the metal layer 33, for example.

As shown in FIG. 3, the plurality of groove portions 50 are provided aligned along one direction (here, X-axis direction) of a plane direction orthogonal to the thickness direction of the metal 31. The plurality of groove portions 50 are provided spaced at predetermined intervals in the X-axis direction, for example. Each groove portion 50 is provided not to overlap the groove portion 40 in a plan view, for example. Each groove portion 50 is provided not to overlap the entire groove portion 40 in a plan view, for example. The plurality of groove portions 50 are aligned at intervals at which they do not overlap the groove portions 40 along the X-axis direction. For example, an interval between the two groove portions 50 adjacent to each other in the X-axis direction is larger than the width dimension of each of the groove portions 40 and 50. In addition, the interval between the two groove portions 40 adjacent to each other in the X-axis direction is larger than the width dimension of each of the groove portions 40 and 50.

Each groove portion 50 extends along one direction of the plane direction orthogonal to the thickness direction of the metal layer 31, for example. Each groove portion 50 extends along a direction (here, the Y-axis direction) orthogonal to the direction (here, the X-axis direction) in which the plurality of groove portions 50 are aligned. Each groove portion 50 extends in a direction corresponding to the moving direction of the working fluid C, for example. The plurality of groove portions 50 are formed to extend in parallel to each other, for example. Each groove portion 50 is formed to extend in parallel to the groove portion 40 in a plan view, for example. A length dimension of each groove portion 50 along the Y-axis direction is the same as a length dimension of each groove portion 40 along the Y-axis direction, for example.

Each groove portion 50 extends towards the liquid pipe 14, for example. Each groove portion 50 extends from the first opening end 15A of the injection passage 15r toward the liquid pipe 14, for example. Each groove portion 50 extends from the first opening end 15A to the middle of the injection passage 15r in the length direction, for example. In other words, each groove portion 50 does not extend to the second opening end 15B in the length direction of the injection passage 15r. That is, each groove portion 50 does not extend to the flow passage 14r of the liquid pipe 14. Each groove portion 50 is not connected to the flow passage 14r, for example. Each groove portion 50 is formed not to communicate directly with the flow passage 14r, for example. Each groove portion 50 extends to a position overlapping a part of the pipe wall 14w of the liquid pipe 14 in the X-axis direction of the length direction of the injection passage 15r, for example.

(Specific Structure of Injection Passage 15r)

As shown in FIG. 2, the injection passage 15r is demarcated by the metal layer 31, the metal layer 32 and the metal layer 31. The injection passage 15r is demarcated by the pair of wall portions 32w, the inner surface 31A of the upper wall 31u, and the inner surface 33A of the lower wall 33d. The injection passage 15r is configured by the through-hole 32X of the metal layer 32, for example.

(Specific Structure of Pipe Wall 15w)

Each pipe wall 15w is configured by, for example, the wall portion 31w of the metal layer 31, the wall portion 32w of the metal layer 32, and the wall portion 33w of the metal layer 33.

(Configuration of Sealed Part 22)

Figure 5:
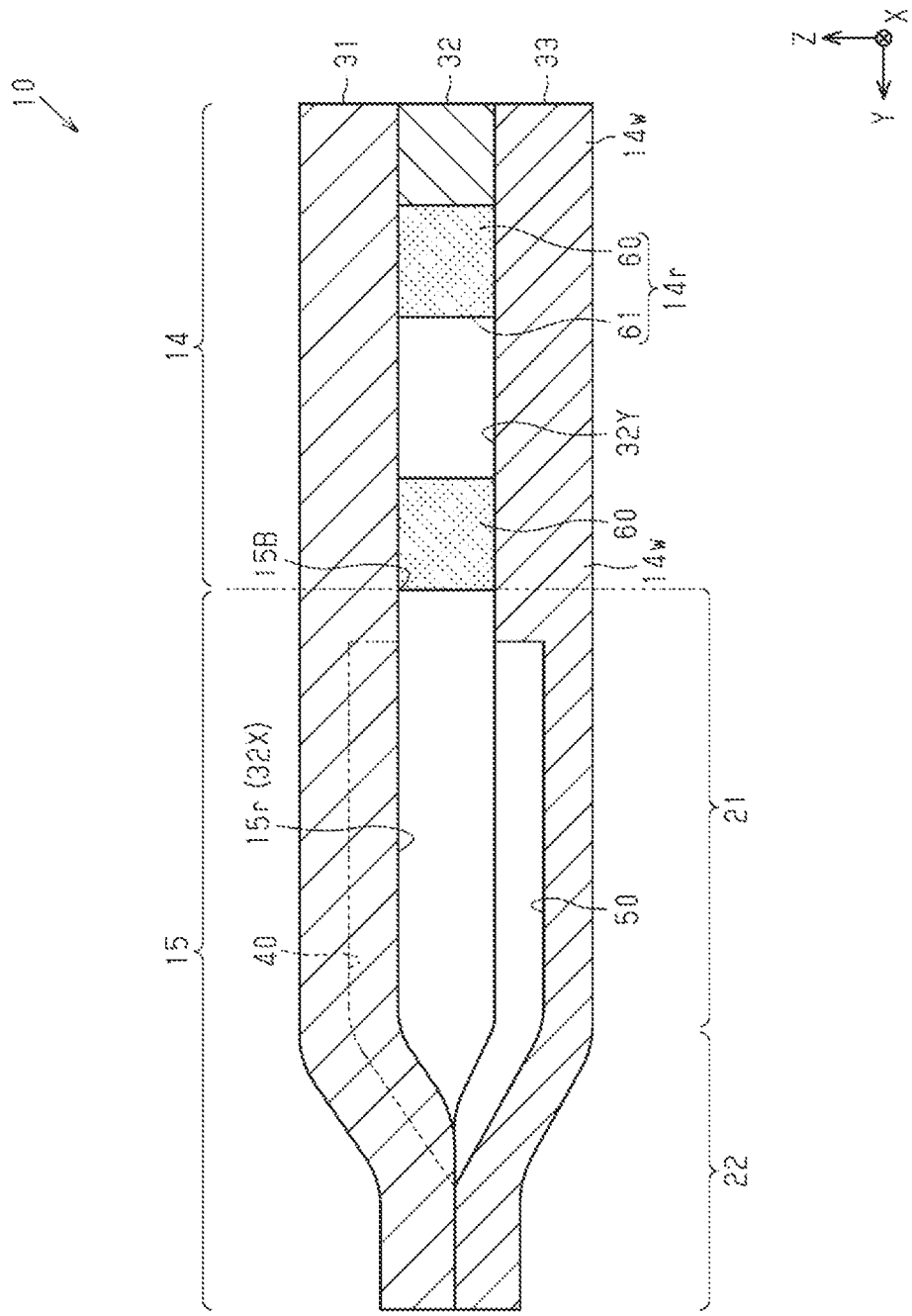
FIG. 5 is a schematic sectional view showing the loop-type heat pipe of one embodiment.

As shown in FIG. 5, the sealed part 22 is formed by crushing and flattening the metal layers 31 to 33 after injecting the working fluid C into the flow passage 14r of the liquid pipe 14. For the formation of the sealed part 22, ultrasonic joining may be used, for example. In the ultrasonic joining, a target object is joined by pressing the target object while applying ultrasonic waves. Note that, in order to promote joining, the target object may be heated. In the sealed part 22, the metal layers 31 to 33 are crushed, and therefore, the injection passage 15r is blocked. By the sealed part 22, the outside of the loop-type heat pipe 10 and the injection passage 15r are separated from each other. Note that, even when a gap partially occurs among the metal layers 31 to 33 in the sealed part 22, etc., airtight sealing is established unless the gap connects the outside of the loop-type heat pipe 10 and the injection passage 15r.

(Configuration of Liquid Pipe 14)

The liquid pipe 14 is formed by the three stacked metal layers 31 to 33, similarly to the injection port 15. As shown in FIG. 3, the liquid pipe 14 has a pair of pipe walls 14w provided on both sides in the width direction (here, the Y-axis direction) orthogonal to the length direction (here, the X-axis direction) of the liquid pipe 14. The liquid pipe 14 has, for example, a porous part 60 and a flow passage 61. The liquid pipe 14 of the present embodiment has a pair of pipe walls 14w, a pair of porous parts 60 provided on the pair of pipe walls 14w, and a flow passage 61 provided between the pair of porous parts 60. Each porous part 60 is continuous with and formed integrally with each pipe wall 14w, for example. Each porous part 60 is a structure having fine pores. Each porous part 60 is configured to have bottomed holes recessed from the upper surface of the metal layer 32, which is the inner metal layer, bottomed holes recessed from the lower surface of the metal layer 32, and fine pores formed by partially communicating the bottomed holes each other. The porous part 60 is configured to guide the working fluid C condensed in the condenser 13 to the evaporator 11 (refer to FIG. 1) by a capillary force generated in the porous part 60. A portion of the porous part 60 is exposed to the second opening end 15B of the injection passage 15r. The porous part 60 is formed to communicate with, for example, the injection passage 15r. However, the porous part 60 is not connected to each of the groove portions 40 and 50, for example. In other words, each of the groove portions 40 and 50 is not connected to the porous part 60. That is, each of the groove portions 40 and 50 is spaced from the porous part 60. For this reason, each of the groove portions 40 and 50 does not communicate directly with the porous part 60.

As shown in FIG. 4, a cross-sectional area of the flow passage 61 is formed larger than a cross-sectional area of the flow passage of the porous part 60, for example. The flow passage 61 is configured by a through-hole 32Y penetrating through the metal layer 32, which is the inner metal layer, in the thickness direction. For example, the flow passage 61 is configured to communicate with the flow passage of the porous part 60. In the liquid pipe 14 of the present embodiment, the flow passage 14r of the liquid pipe 14 is configured by the flow passage of the porous part 60 and the flow passage 61.

(Configuration of Loop-Type Heat Pipe 10)

The evaporator 11, the vapor pipe 12, and the condenser 13 shown in FIG. 1 are formed by the three stacked metal layers 31 to 33 (refer to FIG. 2), like the injection port 15 shown in FIG. 2. The evaporator 11 may have a porous part similar to the porous part 60 (refer to FIG. 4) of the liquid pipe 14, for example. For example, in the evaporator 11, the porous part provided in the evaporator 11 is formed in a comb-teeth shape. In the evaporator 11, a region in which the porous part is not provided has a space. For example, in the vapor pipe 12, the flow passage 12r is formed by forming a through-hole penetrating through the metal layer 32 (refer to FIG. 2), which is an inner metal layer, in the thickness direction. For example, in the condenser 13, the flow passage 13r is formed by forming a through-hole penetrating through the metal layer 32 (refer to FIG. 2), which is an inner metal layer, in the thickness direction.

In this way, the loop-type heat pipe 10 is configured by the three stacked metal layers 31 to 33 (refer to FIG. 2). Note that the number of the stacked metal layers is not limited to 3 layers, and may be 4 or more layers.

Note that, in the present embodiment, the loop-type heat pipe 10 is an example of the heat pipe, the metal layer 31 is an example of the first outer metal layer, the inner surface 31A is an example of the first inner surface, the metal layer 32 is an example of the inner metal layer, the metal layer 33 is an example of the second outer metal layer, and the inner surface 33A is an example of the second inner surface. In addition, the groove portion 40 is an example of the first groove portion, and the groove portion 50 is an example of the second groove portion.

(Operations of Loop-Type Heat Pipe 10)

Next, operations of the loop-type heat pipe 10 will be described.

The loop-type heat pipe 10 includes the evaporator 11 configured to vaporize the working fluid C, the vapor pipe 12 configured to cause the vaporized working fluid C (i.e., vapor Cv) to flow into the condenser 13, the condenser 13 configured to condense the vapor Cv, and the liquid pipe 14 configured to cause the condensed working fluid C to flow into the evaporator 11. The vapor Cv generated in the evaporator 11 due to the heat of the heat-generating component is guided into the condenser 13 through the vapor pipe 12. The vapor Cv is condensed in the condenser 13. That is, the heat generated by the heat-generating component is radiated in the condenser 13. Thereby, the heat-generating component is cooled, and the temperature rise of the heat-generating component is suppressed.

The loop-type heat pipe 10 has the injection port 15 through which the working fluid C is injected into the flow passage 16. The injection port 15 has the injection passage 15r through which the working fluid C moves therein, and the plurality of groove portions 40 and 50 provided on the inner surface of the injection passage 15r. Each of the groove portions 40 and 50 extends toward the liquid pipe 14 along the length direction of the injection port 15. The groove portions 40 and 50 generate the capillary force in the working fluid C when injecting the working fluid C into the loop-type heat pipe 10 through the injection port 15. Thereby, the working fluid C is easily guided from the outside of the loop-type heat pipe 10 into the injection passage 15r by the respective groove portions 40 and 50. Then, the working fluid C is moved in the injection passage 15r by the respective groove portions 40 and 50 and is injected into the flow passage 14r of the liquid pipe 14 from the second opening end 15B of the injection passage 15r.

(Manufacturing Method of Loop-Type Heat Pipe 10)

Next, a manufacturing method of the loop-type heat pipe 10 will be described.

First, in a process shown in FIG. 6A, a flat plate-shaped metal sheet 71 is prepared. The metal sheet 71 is a member that finally becomes the metal layer 31 (refer to FIG. 2). The metal sheet 71 is made of, for example, copper, stainless steel, aluminum, a magnesium alloy, or the like. A thickness of the metal sheet 71 may be set to about 50 μm to 200 μm, for example.

Subsequently, a resist layer 72 is formed on a lower surface of the metal sheet 71, and a resist layer 73 is formed on an upper surface of the metal sheet 71. As the resist layers 72 and 73, for example, a photosensitive dry film resist or the like may be used.

Next, in a process shown in FIG. 6B, the resist layer 72 is exposed and developed to form opening portions 72X for selectively exposing the lower surface of the metal sheet 71.

The opening portions 72X are formed to correspond to the groove portions 40 shown in FIG. 2.

Subsequently, in a process shown in FIG. 6C, the metal sheet 71 exposed in the opening portions 72X is etched (half-etched) from the lower surface side of the metal sheet 71. Thereby, the lower surface of the metal sheet 71 is formed with groove portions 40. The groove portions 40 can be formed by, for example, wet-etching the metal sheet 71 by using the resist layers 72 and 73 as an etching mask. When copper is used as the material of the metal sheet 71, a ferric chloride aqueous solution or a copper chloride aqueous solution may be used as an etching solution.

Next, the resist layers 72 and 73 are peeled off by a peel-off solution. Thereby, as shown in FIG. 6D, a metal layer 31 having the groove portions 40 formed in the inner surface 31A can be formed.

Next, in a process shown in FIG. 7A, a flat plate-shaped metal sheet 74 is prepared. The metal sheet 74 is a member that finally becomes the metal layer 32 (refer to FIG. 2). The metal sheet 74 is made of, for example, copper, stainless steel, aluminum, a magnesium alloy, or the like. A thickness of the metal sheet 74 may be set to about 50 μm to 200 μm, for example.

Subsequently, a resist layer 75 is formed on a lower surface of the metal sheet 74, and a resist layer 76 is formed on an upper surface of the metal sheet 74. As the resist layers 75 and 76, for example, a photosensitive dry film resist or the like can be used.

Next, in a process shown in FIG. 7B, the resist layer 75 is exposed and developed to form an opening portion 75X for selectively exposing the lower surface of the metal sheet 74. Similarly, the resist layer 76 is exposed and developed to form an opening portion 76X for selectively exposing the upper surface of the metal sheet 74. The opening portions 75X and 76X are formed to correspond to the through-hole 32X shown in FIG. 2. The opening portion 75X and the opening portion 76X are provided at positions overlapping each other in a plan view.

Next, in a process shown in FIG. 7C, the metal sheet 74 exposed from the resist layers 75 and 76 are etched from both the upper and lower surfaces of the metal sheet 74. A through hole 32X is formed in the metal sheet 74 by the opening portions 75X and 76X. The through-hole 32X may be formed by, for example, wet-etching the metal sheet 74 by using the resist layers 75 and 76 as an etching mask. When copper is used as the material of the metal sheet 74, a ferric chloride aqueous solution or a copper chloride aqueous solution may be used as an etching solution.

Next, the resist layers 75 and 76 are peeled off by a peel-off solution. Thereby, as shown in FIG. 7D, a metal layer 32 having the through-hole 32X can be formed. Subsequently, in a process shown in FIG. 8A, a metal layer 33 having groove portions 50 in an inner surface 33A is formed by a method similar to the processes shown in FIGS. 6A to 6D. Next, the metal layer 32 is arranged between the metal layer 31 and the metal layer 33.

Next, in a process shown in FIG. 8B, the stacked metal layers 31 to 33 are pressed while heating the same to a predetermined temperature (for example, about 900° C.), so that the metal layers 31 to 33 are joined by the solid-phase bonding. Thereby, the metal layers 31, 32 and 33 adjacent to each other in the laminating direction are directly joined.

By the processes described above, a structure in which the metal layers 31, 32, and 33 are stacked is formed. Then, while the injection port 15 before sealing is formed, the evaporator 11, the vapor pipe 12, the condenser 13, and the liquid pipe 14 shown in FIG. 1 are formed.

Figure 9A:
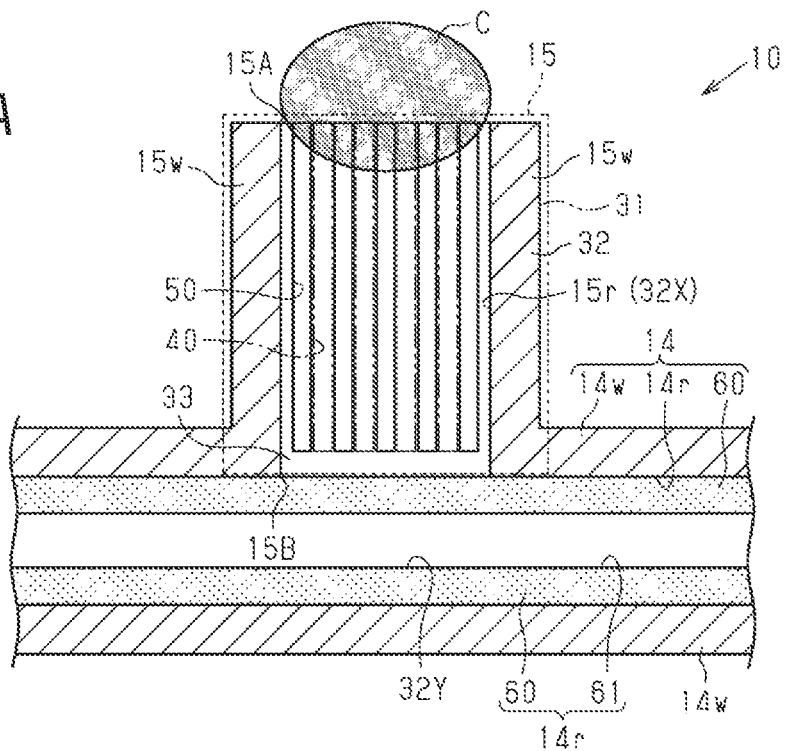
FIGS. 9A and 9B are schematic sectional views showing the manufacturing method of a loop-type heat pipe of one embodiment.
Figure 9B:
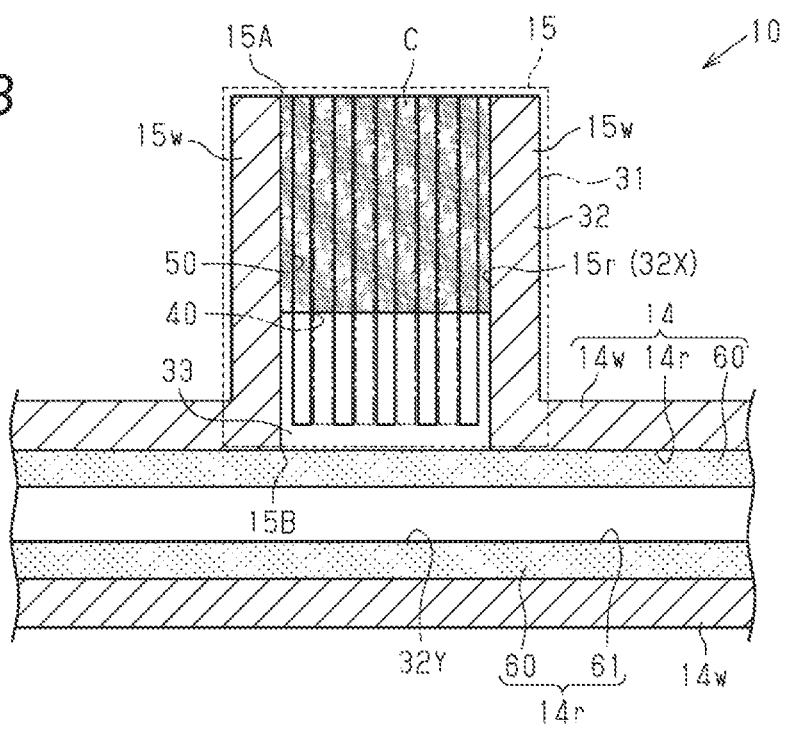

Next, in processes shown in FIGS. 9A and 9B, after exhausting the inside of the liquid pipe 14 by using a vacuum pump or the like, the working fluid C is injected into the liquid pipe 14 from the injection port 15. At this time, in the injection port 15, capillary force is generated by the groove portions 40 and 50 provided in the inner surface of the injection passage 15r. The capillary force by the groove portions 40 and 50 facilitates drawing of the working fluid C into the loop-type heat pipe 10. Thereby, even when the injection port 15 for injecting the working fluid C is narrowed along with the thinning of the loop-type heat pipe 10, a small amount of the working fluid C can be stably drawn into the inside.

Subsequently, after the injection of the working fluid C is completed, a part of the injection port 15 in the length direction is crushed and flattened to form the sealed part 22 shown in FIG. 5, and accordingly, the injection port is airtightly sealed so that the working fluid C injected into the liquid pipe 14 is not leaked outside. For example, the injection port 15 is airtightly sealed by pressing the metal layers 31, 32, and 33 (refer to FIG. 8B) in the laminating direction at a part, in the length direction, of the injection port 15 to form the sealed part 22.

Next, the effects of the present embodiment are described.

(1) The loop-type heat pipe 10 has the injection port 15 through which the working fluid C is injected into the flow passage 16. The injection port 15 has the injection passage 15r through which the working fluid C moves therein, and the groove portions 40 provided in the inner surface 31A of the metal layer 31 at a part constituting the inner surface of the injection passage 15r. The groove portions 40 extend toward the liquid pipe 14 along the length direction of the injection port 15. When injecting the working fluid C into the flow passage 16 through the injection port 15, the groove portions 40 generate the capillary force in the working fluid C. The capillary force by the groove portions 40 facilitates drawing of the working fluid C into the loop-type heat pipe 10. Thereby, the working fluid C can be easily injected into the loop-type heat pipe 10, as compared with a case in which the groove portions 40 are not provided. For this reason, even when the injection port 15 is narrowed along with the thinning of the loop-type heat pipe 10, it is possible to stably draw a small amount of the working fluid C into the inside. In addition, since a small amount of the working fluid C can be stably drawn into the inside, it is possible to improve the controllability of the injection amount of the working fluid C, and to easily inject a target amount of the working fluid C.

(2) The injection port 15 has the groove portions 50 provided in the inner surface 33A of the metal layer 33 at a part constituting the inner surface of the injection passage 15r. The groove portions 50 extend toward the liquid pipe 14 along the length direction of the injection port 15. When injecting the working fluid C into the flow passage 16 through the injection port 15, the groove portions 50 generate the capillary force in the working fluid C. The capillary force by the groove portions 50 facilitates drawing of the working fluid C into the loop-type heat pipe 10. Thereby, the working fluid C can be easily injected into the loop-type heat pipe 10, as compared with a case in which the groove portions 50 are not provided.

(3) Here, even when the injection port 15 is thinned in the thickness direction, the surface areas of the inner surfaces 31A and 33A constituting the inner surface of the injection passage 15r on both sides of the injection port 15 in the thickness direction remain unchanged. For this reason, the surface areas of the inner surfaces 31A and 33A in which the groove portions 40 and 50 are formed can maintain predetermined surface areas, regardless of the thinning of the injection port 15. Thereby, even when the injection port 15 is reduced in thickness, the formation regions of the groove portions 40 and 50 can be maintained. Therefore, the capillary force by the groove portions 40 and 50 can favorably draw the working fluid C into the loop-type heat pipe 10 by.

(4) If the groove portions 40 and 50 are provided overlapping each other in a plan view, the upper side wall 31u and the lower side wall 33d constituting the pipe wall of the injection passage 15r are all thinned at the same positions at the parts in which the groove portions 40 and 50 are formed, and therefore, are lowered in rigidity and may be damaged by the pressure at the time when injecting the working fluid C. In contrast, in the injection port 15 of the present embodiment, the groove portions 50 are provided not to overlap the groove portions 40 in a plan view. That is, the groove portions 40 and the groove portions 50 are provided at positions offset from with each other in a plan view. Thereby, compared to the case in which the groove portions 40 and 50 are provided overlapping each other in a plan view, any one of the upper wall 31u and the lower wall 33d constituting the pipe wall of the injection passage 15r is secured to have a thick wall, and therefore, can be suppressed from being damaged due to the pressure at the time when injecting the working fluid C.

(5) The groove portions 40 and 50 extend toward the liquid pipe 14 and are spaced from the porous part 60 provided in the liquid pipe 14. That is, the groove portions 40 and 50 are formed not to communicate directly with the porous part 60. For this reason, the groove portions 40 and 50 can be designed separately from the design of the porous part 60. That is, the groove portions 40 and 50 can be designed to have an arbitrary shape independent of the porous part 60, and the positions to be placed can also be freely set. This makes it possible to improve the degree of design freedom of the groove portions 40 and 50.

Further, the groove portions 40 and 50 are formed apart from the porous part 60 so as not to communicate directly with the porous part 60. For this reason, the working fluid C can be stored in the groove portions 40 and 50, which are areas spaced from the porous part 60.

(6) The inner surface 31A of the metal layer 31 is provided with a large number of groove portions 40 each having a small width dimension. Here, the width dimension of each groove portion 40 is formed small, so that the capillary force by the groove portion 40 can be increased. For this reason, a large number of groove portions 40 each having a small width dimension are provided, so that it is easier to draw the working fluid C into the loop-type heat pipe 10. Thereby, the working fluid C can be easily injected into the loop-type heat pipe 10.

OTHER EMBODIMENTS

The above embodiment can be changed and implemented, as follows. The above embodiment and the following modified embodiments can be implemented in combination with each other within a technically consistent range.

In the above embodiment, the plurality of groove portions 40 are formed to have the same dimensions in the length direction, and the plurality of groove portions 50 are formed to have the same dimensions in the length direction. However, the present invention is not limited thereto. For example, the dimensions of the plurality of groove portions 40 in the length direction may be individually set. For example, the dimensions of the plurality of groove portions 50 in the length direction may be individually set.

Figure 10:
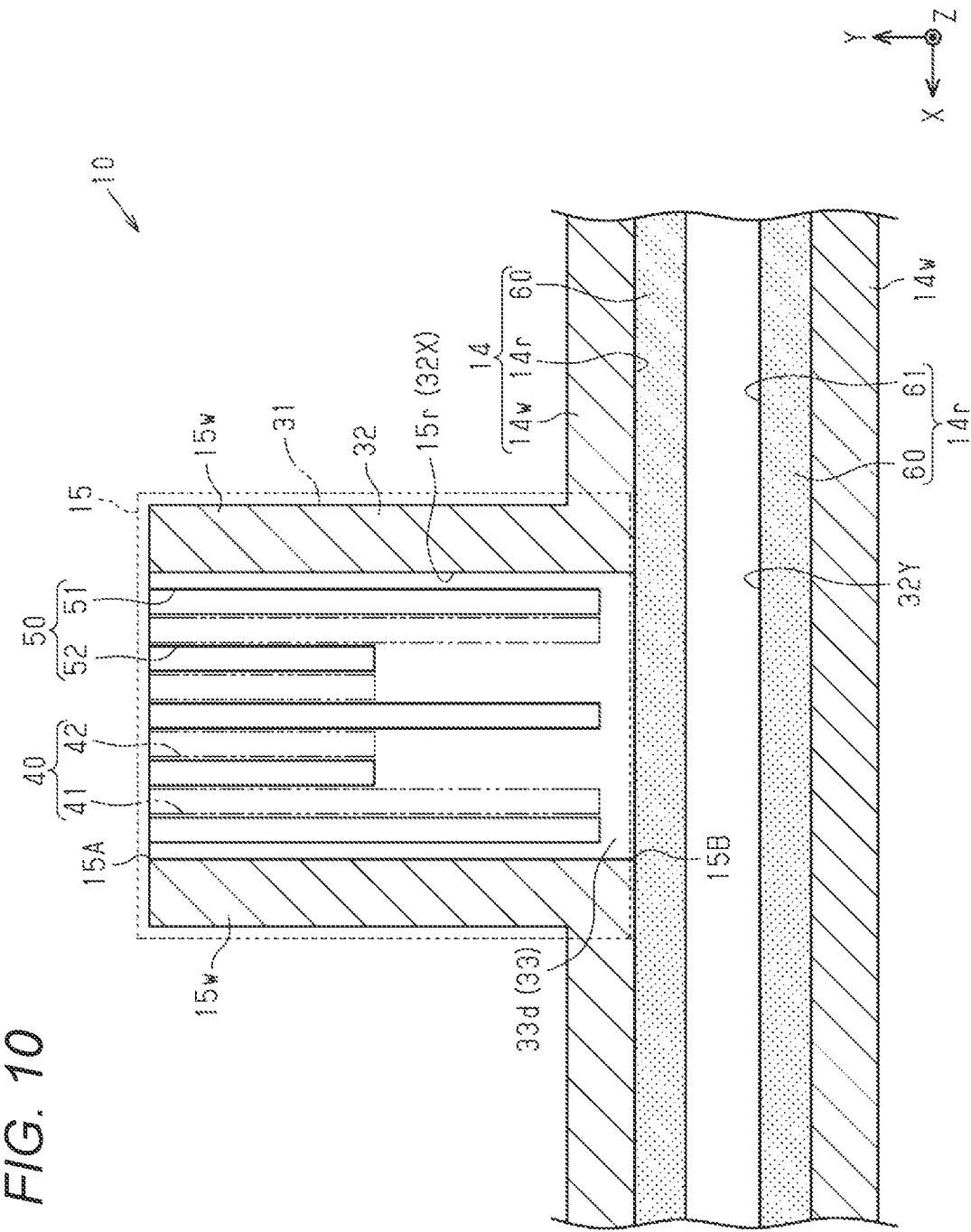
FIG. 10 is a schematic sectional view showing a loop-type heat pipe of a modified embodiment.

For example, as shown in FIG. 10, the plurality of groove portions 40 may include grooves 41, and grooves 42 smaller than the grooves 41 in dimension in the length direction. In this modified embodiment, the plurality of groove portions 40 include two groove portions 41 and two groove portions 42. In this modified embodiment, a dimension of each groove portion 42 in the length direction is set to about a half of a dimension of the groove portion 41 in the length direction.

The plurality of groove portions 50 may include, for example, groove portions 51 and groove portions 52 smaller than the groove portions 51 in dimension in the length direction. In this modified embodiment, the plurality of groove portions 50 include three groove portions 51 and two groove portions 52. In this modified embodiment, a dimension of each groove portion 52 in the length direction is set to about a half of a dimension of the groove portion 51 in the length direction.

In this configuration, in the length direction of the injection passage 15r, portions in which only the groove portions 41 and 51 of the groove portions 41, 42, 51 and 52 are provided are formed. In the portions in which only the groove portions 41 and 51 are provided, the rigidity of the upper wall 31u and the lower wall 33d constituting the pipe wall of the injection passage 15r can be increased, as compared with portions in which all of the groove portions 41, 42, 51 and 52 are formed.

In the modified embodiment shown in FIG. 10, the number, arrangement, and length of the groove portions 41, 42, 51, and 52 can be changed as appropriate.

In the above embodiment, the plurality of groove portions 40 are formed to have the same dimensions in the width direction, and the plurality of groove portions 50 are formed to have the same dimensions in the width direction. However, the present invention is not limited thereto. For example, the dimensions of the plurality of groove portions 40 in the width direction may be individually set. For example, the dimensions of the plurality of groove portions 50 in the width direction may be individually set.

In the above embodiment, the plurality of groove portions 40 are formed to have the same dimensions in the depth direction, and the plurality of groove portions 50 are formed to have the same dimensions in the depth direction. However, the present invention is not limited thereto. For example, the dimensions of the plurality of groove portions 40 in the depth direction may be individually set. For example, the dimensions of the plurality of groove portions 50 in the depth direction may be individually set.

In the above embodiment, the planar shape of each of the groove portions 40 and 50 is formed in a rectangular shape extending along the Y-axis direction. However, the present invention is not limited thereto. The planar shape of each of the groove portions 40 and 50 can be formed in an arbitrary shape. For example, the planar shape of each of the groove portions 40 and 50 can be appropriately changed according to the shape of the entire injection port 15 or the direction in which the working fluid C flows.

Figure 11:
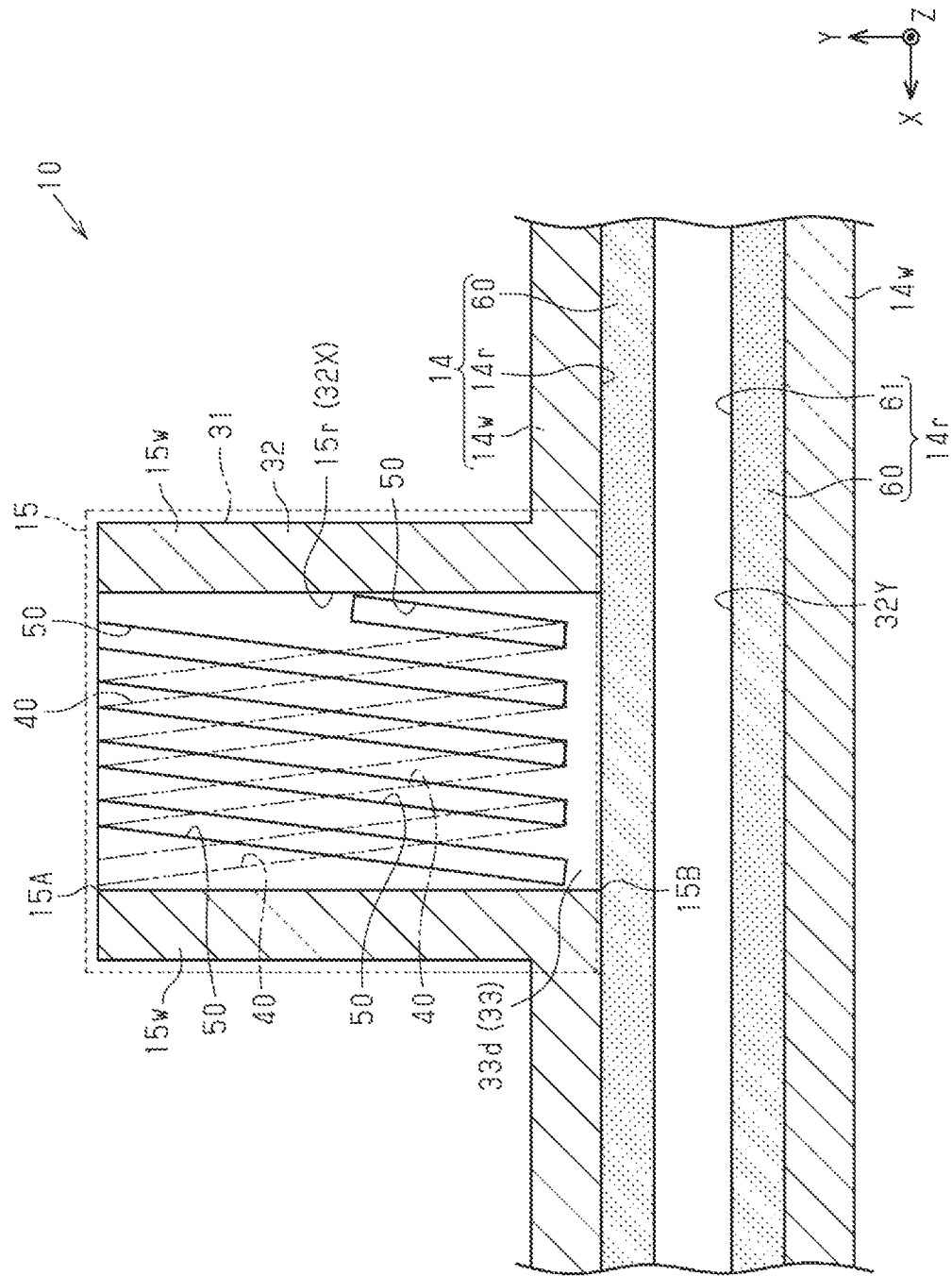
FIG. 11 is a schematic sectional view showing a loop-type heat pipe of a modified embodiment.

For example, as shown in FIG. 11, each of the groove portions 40 and 50 may be formed to extend in a direction intersecting with both the X-axis direction and the Y-axis direction in the XY plane. For example, each groove portion 40 may be formed to extend in a first direction intersecting with both the X-axis direction and the Y-axis direction, and each groove portion 50 may be formed to extend in a second direction intersecting with both the X-axis direction and the Y-axis direction and the first direction. In this case, the groove portion 40 and the groove portion 50 are formed to intersect with each other in a plan view. For this reason, in this modified embodiment, the groove portion 40 and the groove portion 50 are formed to partially overlap each other in a plan view. In this modified embodiment, for example, while the plurality of groove portions 40 are provided aligned along a third direction orthogonal to the first direction in the XY plane, the plurality of groove portions 50 are provided aligned along a fourth direction orthogonal to the second direction in the XY plane.

Figure 12:
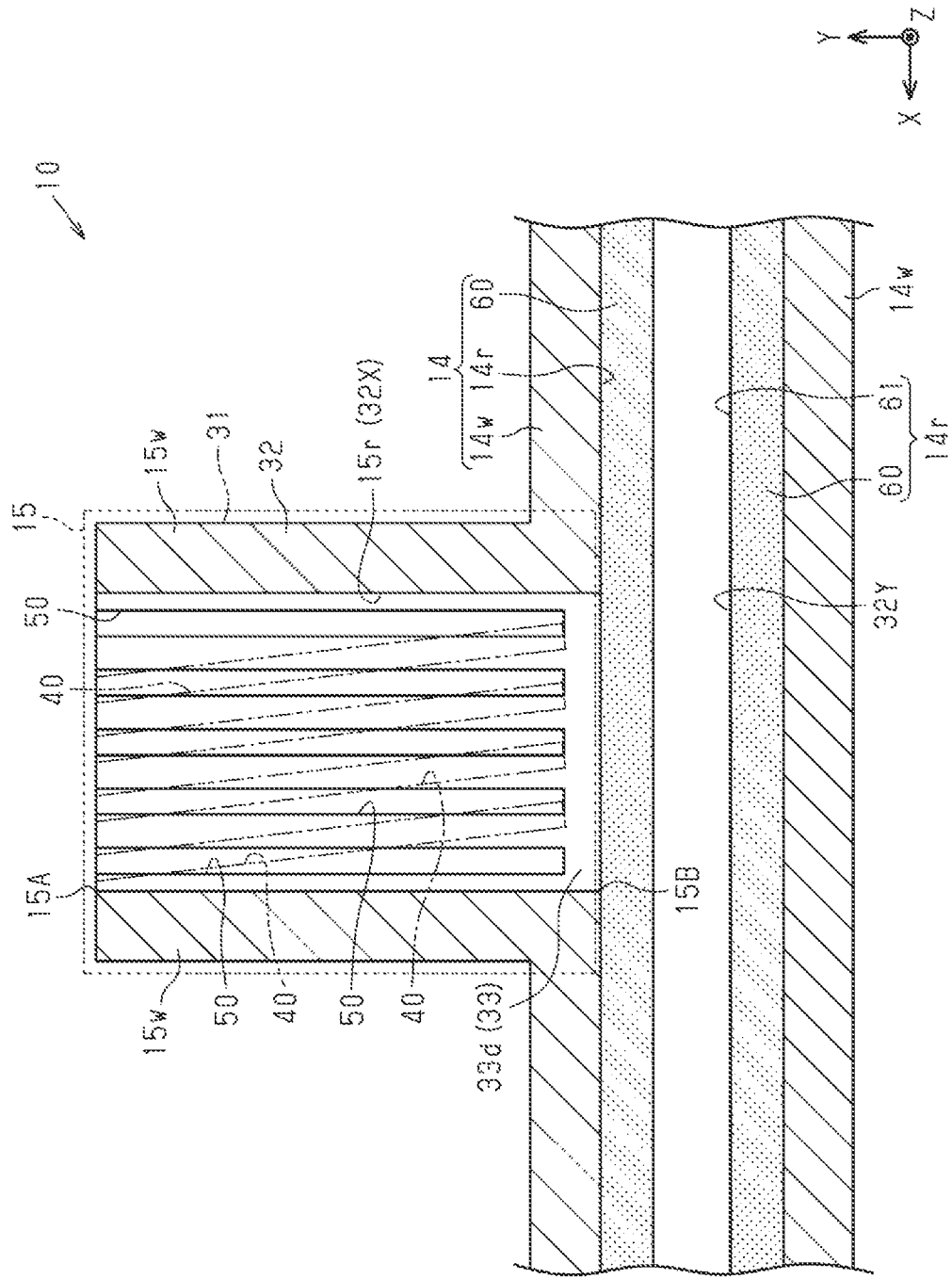
FIG. 12 is a schematic sectional view showing a loop-type heat pipe of a modified embodiment.

For example, as shown in FIG. 12, each groove portion 40 may be formed to extend in the first direction intersecting with both the X-axis direction and the Y-axis direction, and each groove portion 50 may be formed to extend along the Y-axis direction. In this case, the groove portion 40 and the groove portion 50 are formed to partially overlap each other in a plan view.

In the above embodiment and each of the above modified embodiments, the respective groove portions 40 and 50 are formed in both the unsealed part 21 and the sealed part 22. However, the present invention is not limited thereto. For example, the respective groove portions 40 and 50 in the above embodiment and each of the above modified embodiments may be provided only in the unsealed part 21 without being provided in the sealed part 22.

Figure 13:
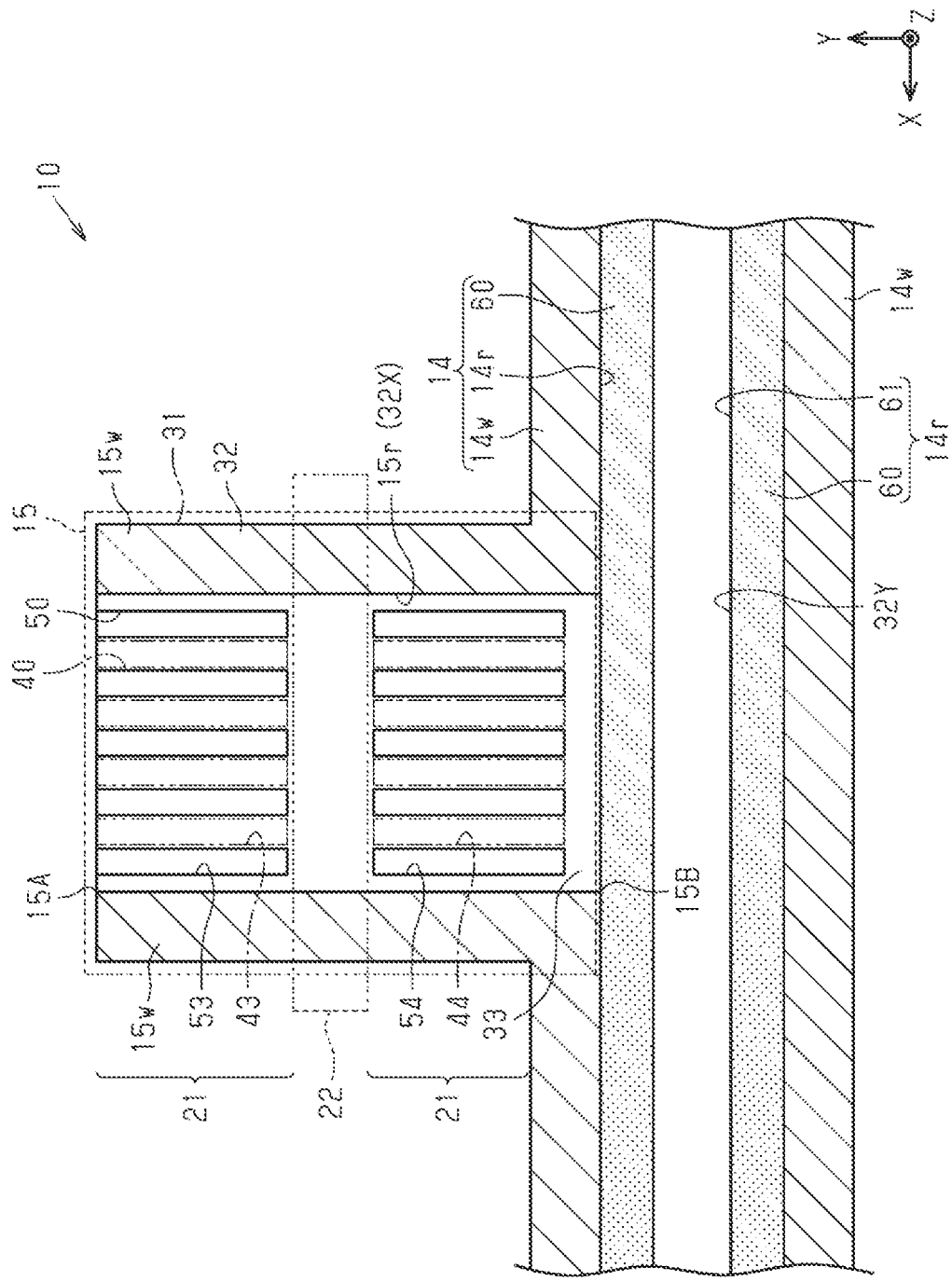
FIG. 13 is a schematic sectional view showing a loop-type heat pipe of a modified embodiment.

For example, as shown in FIG. 13, in the injection port 15 before forming the sealed part 22, the respective groove portions 40 and 50 may not be provided in a part to be the sealed part 22. In this modified embodiment, the part to be the sealed part 22 is provided in a middle part of the injection passage 15*r* in the length direction. In this modified embodiment, each of the groove portions 40 and 50 is not provided in the middle part of the injection passage 15*r* in the length direction. In this modified embodiment, each of the groove portions 40 and 50 is formed to extend along the Y-axis direction toward the liquid pipe 14 and to divide at the middle part of the injection passage 15*r* in the length direction. Specifically, in this modified embodiment, each groove portion 40 has a groove portion 43 provided on the first opening end 15A side with respect to a part to be the sealed part 22 in the Y-axis direction, and a groove portion 44 provided on the second opening end 15B side with respect to the part to be the sealed part 22 in the Y-axis direction. In this modified embodiment, each groove portion 50 has a groove portion 53 provided on the first opening end 15A side with respect to the part to be the sealed part 22 in the Y-axis direction, and a groove portion 54 provided on the second opening end 15B side with respect to the part to be the sealed part 22 in the Y-axis direction. These groove portions 43, 44, 53, and 54 are not provided in the sealed part 22 but are provided only in the unsealed part 21, after formation of the sealed part 22.

According to this configuration, since the groove portions 40 and 50 are not provided in the sealed part 22, the decrease in rigidity of the injection port 15 in the sealed part 22 can be favorably suppressed.

In the above embodiment and each of the modified embodiments, each of the groove portions 40 and 50 is formed to extend from the first opening end 15A toward the liquid pipe 14 in the length direction of the injection port 15. However, the present invention is not limited thereto.

Figure 14:
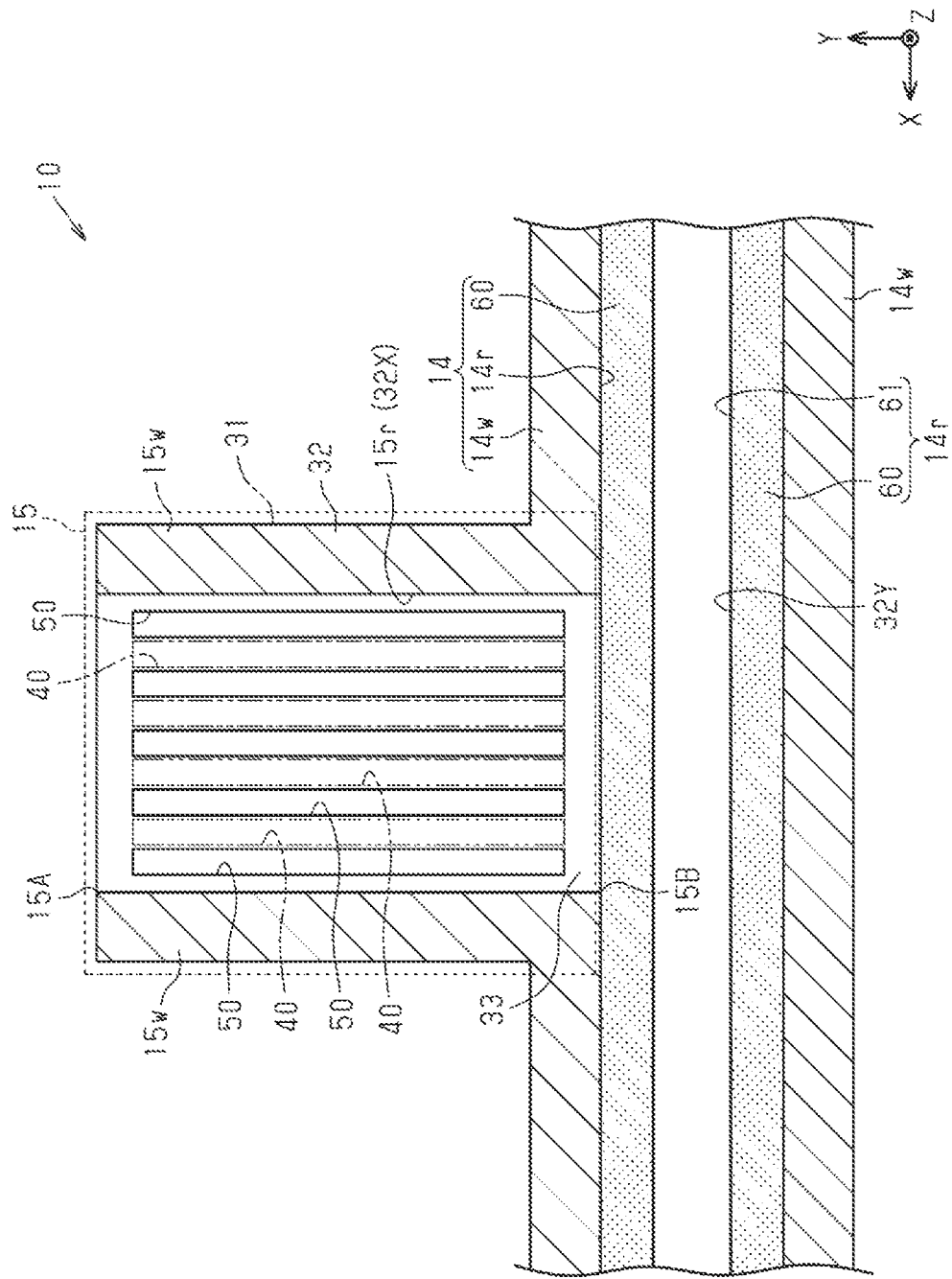
FIG. 14 is a schematic sectional view showing a loop-type heat pipe of a modified embodiment.

For example, as shown in FIG. 14, each of the groove portions 40 and 50 may be formed to extend from a position apart from the first opening end 15A to the second opening end 15B side, toward the liquid pipe 14 in the length direction of the injection port 15.

Figure 15:
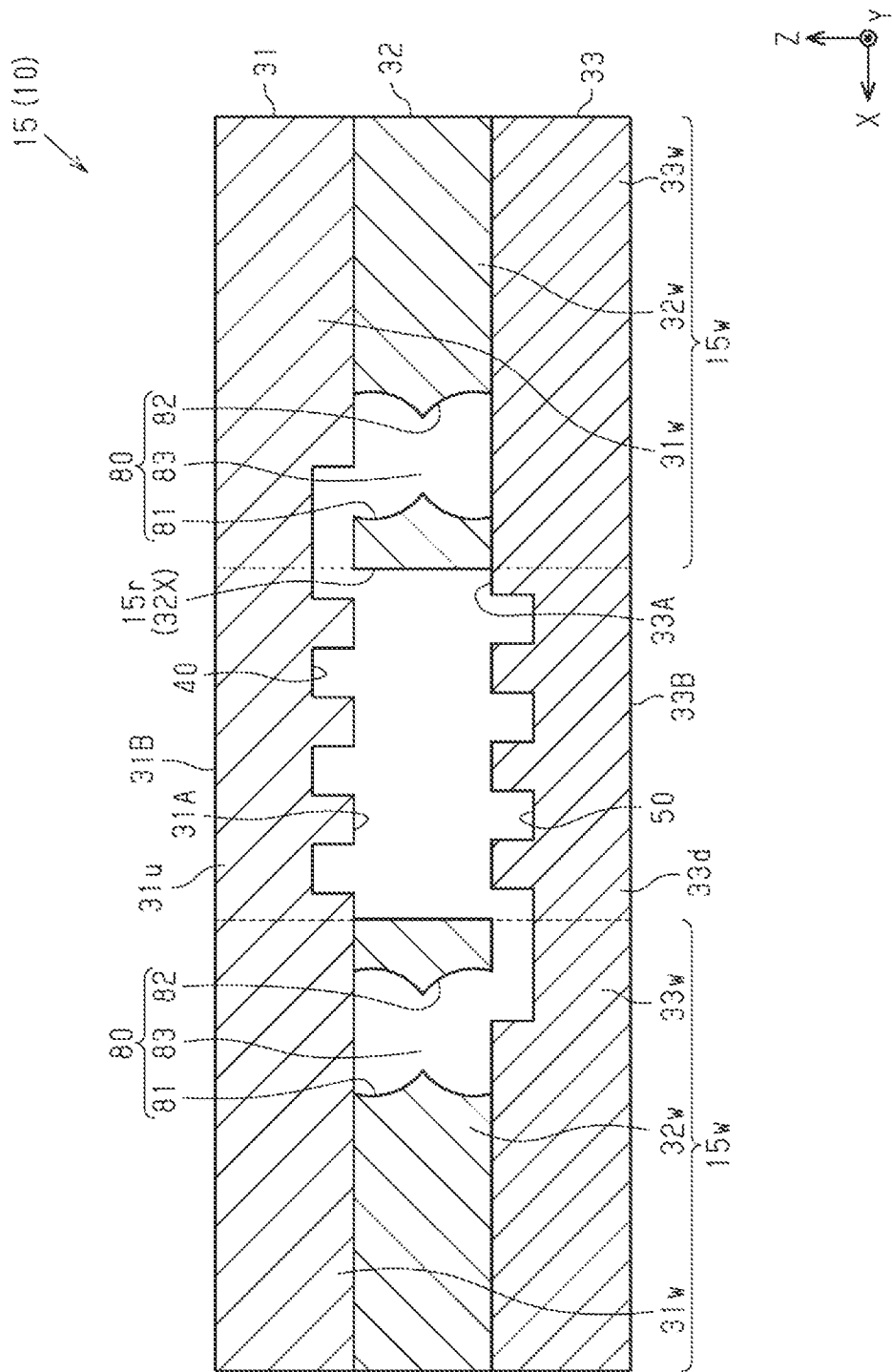
FIG. 15 is a schematic sectional view showing an injection port of a modified embodiment.

As shown in FIG. 15, a porous body 80 may be provided in the injection port 15. The porous body 80 is provided in the wall portion 32*w* of the metal layer 32, for example. In the injection port 15 of this modified embodiment, the porous body 80 is provided in each of the two wall portions 32*w*. Each porous body 80 is formed integrally with the wall portion 32*w*, for example.

The porous body 80 of this modified embodiment has a bottomed hole 81 recessed from the upper surface of the metal layer 32, a bottomed hole recessed from the lower surface of the metal layer 32, and a fine pore formed by partially communicating the bottomed hole 81 and the bottomed hole 82 each other. The bottomed hole 81 is formed to be recessed from the upper surface of the metal layer 32 to a middle portion in the thickness direction of the metal layer 32. The bottomed hole 82 is formed to be recessed from the lower surface of the metal layer 32 to the middle portion in the thickness direction of the metal layer 32. A depth of each of the bottomed holes 81 and 82 may be set to about 25 μm to 100 μm, for example.

An inner surface of each of the bottomed holes 81 and 82 is formed in a shape continuing in an arc shape from an opening side (upper or lower surfaces side of the metal layer 32) to a bottom surface side, for example. The inner surface of each of the bottomed holes 81 and 82 is formed to have a curved surface curved in an arc shape in a cross-sectional view. A bottom surface of each of the bottomed holes 81 and 82 is formed in a curved surface curved in an arc shape, for example. The bottom surface of each of the bottomed holes 81 and 82 is formed to be continuous with the inner surface of each of the bottomed holes 81 and 82, for example. A radius of curvature of the bottom surface of each of the bottomed holes 81 and 82 may be the same as a radius of curvature of the inner surface of each of the bottomed holes 81 and 82, or may be different from the radius of curvature of the inner surface of each of the bottomed holes 81 and 82.

Note that the inner surface of each of the bottomed holes 81 and 82 may be formed in a concave shape having a semi-circular or semi-elliptical shape in a section. As used herein, in the present specification, the 'semi-circular shape' includes not only a semicircle obtained by bisecting a true circle, but also, for example, one having an arc longer or shorter than the semicircle. In addition, in the present specification, the 'semi-elliptical shape' includes not only a semi-ellipse obtained by bisecting an ellipse, but also, for example, one having an arc longer or shorter than the semi-ellipse. Further, the inner surface of each of the bottomed holes 81 and 82 may be formed in a tapered shape expanding from the bottom surface side toward the opening side. Further, the bottom surface of each of the bottomed holes 81 and 82 may be formed to be a plane parallel to the upper surface of the metal layer 32, and the inner side surface of each of the bottomed holes 81 and 82 may be formed to extend perpendicularly to the bottom surface.

Figure 16:
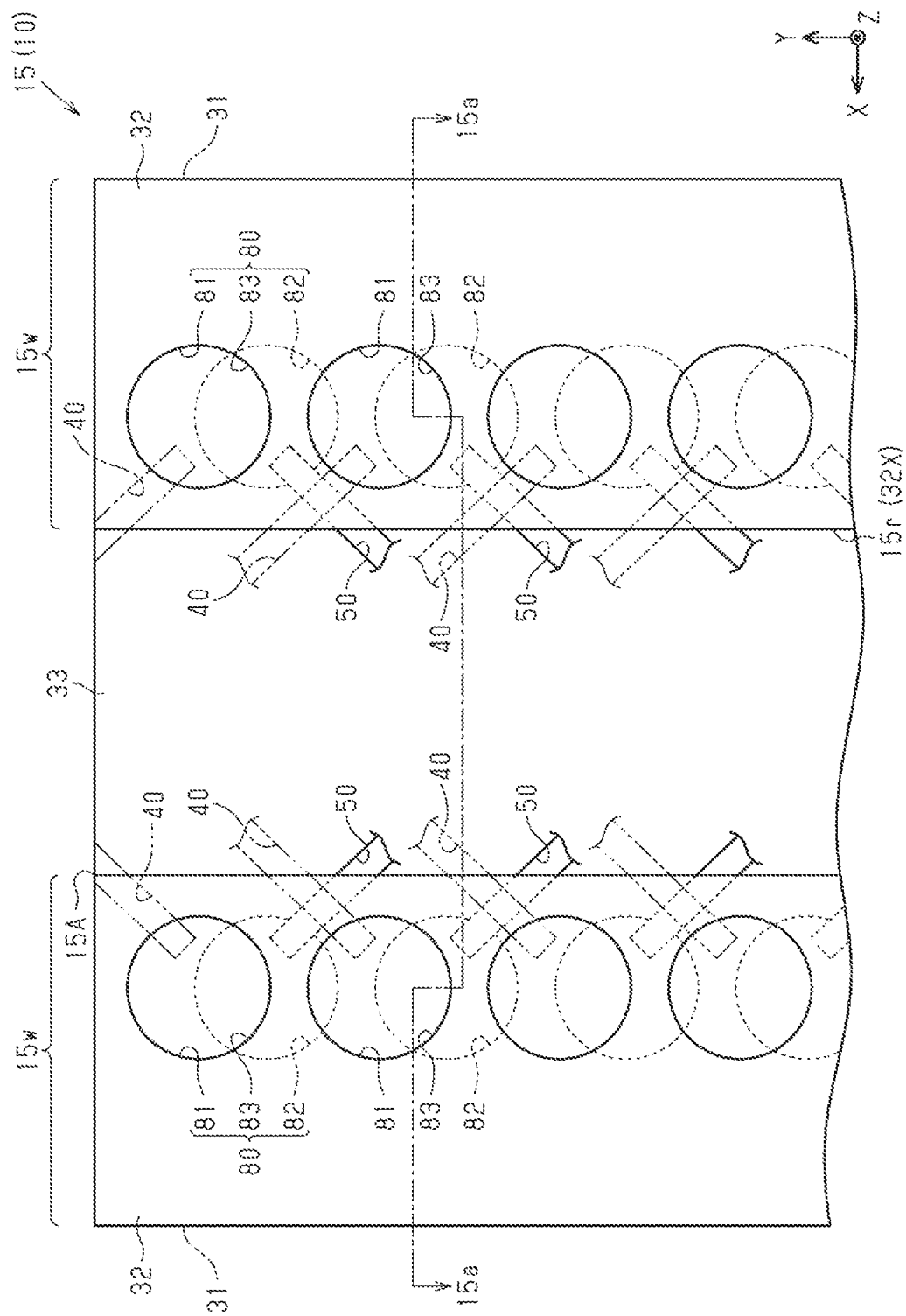
FIG. 16 is a schematic sectional view showing an injection port of a modified embodiment.

As shown in FIGS. 16, the bottomed holes 81 and 82 are each formed in a circular shape in a plan view, for example. A diameter of each of the bottomed holes 81 and 82 may be set to about 100 μm to 400 μm, for example. Note that the planar shape of each of the bottomed holes 81 and 82 may be formed in an arbitrary shape such as an ellipse or a polygon.

The plurality of bottomed holes portions 81 are provided aligned along one direction (here, Y-axis direction) of a plane direction orthogonal to the thickness direction of the metal 32. The plurality of bottomed holes 81 are provided spaced at predetermined intervals in the Y-axis direction, for example. The plurality of bottomed holes 82 are provided aligned along one direction (here, Y-axis direction) of a plane direction orthogonal to the thickness direction of the metal 32. The plurality of bottomed holes 82 are provided spaced at predetermined intervals in the Y-axis direction, for example. The plurality of bottomed holes 81 and 82 of this modified embodiment are provided aligned on a straight line along the Y-axis direction. Each bottomed hole 81 is provided to partially overlap the bottomed hole 82 in a plan view. Each bottomed hole 81 is provided to partially overlap each of two bottomed holes 82 adjacent in the Y-axis direction in a plan view. Each bottomed hole 81 is formed to communicate two bottomed holes 82 adjacent to each other in the Y-axis direction each other. Further, each bottomed hole 82 is provided to partially overlap each of two bottomed holes 81 adjacent in the Y-axis direction in a plan view. Each bottomed hole 82 is formed to communicate two bottomed holes 81 adjacent to each other in the Y-axis direction each other. In the portion in which the bottomed hole 81 and the bottomed hole 82 overlap in a plan view, the bottomed hole 81 and the bottomed hole 82 partially communicate to form the pore 83. Note that, in FIG. 16, the metal layer 31 is drawn in a see-through manner.

As shown in FIG. 15, the bottomed holes 81 and 82 are provided apart from a side surface of the wall portion 32w constituting the inner surface of the injection passage 15r, for example. For this reason, the bottomed holes 81 and 82 are provided apart from the injection passage 15r in the X-axis direction. That is, the bottomed holes 81 and 82 are provided in the middle portion of the wall portion 32w in the width direction. The bottomed holes 81 and 82 are not directly connected to the injection passage 15r. The bottomed holes 81 and 82 do not communicate directly with the injection passage 15r.

The groove portions 40 and 50 of this modified embodiment are formed to communicate the porous body 80 and the injection passage 15r each other. The groove portion 40 of this modified embodiment is formed to communicate the bottomed hole 81 and the injection passage 15r each other. The groove portion 40 is formed, for example, in the inner surface 31A of the upper wall 31u and in the inner surface 31A of the wall portion 31w. As shown in FIG. 16, each groove portion 40 is formed to communicate one bottomed hole 81 and the injection passage 15r each other, for example. Each groove portion 40 is formed to extend in a direction intersecting with both the X-axis direction and the Y-axis direction in a plan view, for example. Each groove portion 40 is formed to extend from the first opening end 15A side toward each bottomed hole 81, for example. As shown in FIG. 15, the groove portion 50 of this modified embodiment is formed to communicate the bottomed hole 82 and the injection passage 15r each other. The groove portion 50 is formed, for example, in the inner surface 33A of the lower wall 33d and in the inner surface 33A of the wall portion 33w. As shown in FIG. 16, each groove portion 50 is formed to communicate one bottomed hole 82 and the injection passage 15r each other, for example. Each groove portion 50 is formed to extend in a direction intersecting with both the X-axis direction and the Y-axis direction in a plan view, for example. Each groove portion 50 is formed to extend from each bottomed hole 82 toward the liquid pipe 14 (refer to FIG. 3), for example. In this way, in the injection port 15 of this modified embodiment, the bottomed holes 81 and 82, the pores 83, and the groove portions 40 and 50 communicate with one another. A space formed by communicating the bottomed holes 81 and 82, the pores 83 and the groove portions 40 and 50 is three-dimensionally expanded. Note that FIGS. 15 and 16 show the injection port 15 before sealing. In addition, FIG. 15 shows a section of the injection port 15 at a position corresponding to a line 15a-15a of FIG. 16.

According to this configuration, when injecting the working fluid C into the flow passage 16 through the injection port 15, the capillary force is generated by the groove portions 40 and 50 provided in the inner surface of the injection port 15, and by the porous body 80 provided in the injection port 15. The capillary force by the groove portions 40 and 50 and the porous body 80 facilitates drawing of the working fluid C into the loop-type heat pipe 10. Thereby, the working fluid C can be easily injected into the loop-type heat pipe 10, as compared with a case in which the groove portions 40 and 50 and the porous body 80 are not provided.

Note that, in this modified embodiment, the bottomed hole 81 is an example of the first bottomed hole, and the bottomed hole 82 is an example of the second bottomed hole. In the above embodiment, the groove portion 40 and the groove portion 50 are provided not to overlap each other in a plan view. However, the present invention is not limited thereto. For example, the groove portion 40 and the groove portion 50 may be provided to overlap each other in a plan view. For example, the entire groove portion 40 may be formed to overlap the groove portion 50 in a plan view. For example, the groove portion 40 and the groove portion 50 may be provided to partially overlap each other in a plan view.

The cross-sectional shape of the groove portions 40 and 50 in the above embodiment can be appropriately changed. For example, the inner surface of each of the groove portions 40 and 50 may be formed in a tapered shape expanding from the bottom surface side toward the opening side. The inner surface of each of the groove portions 40 and 50 may also be formed in a shape continuing in an arc shape from the opening side toward the bottom surface side. The inner surface of each of the groove portions 40 and 50 may also be formed in a concave shape having a semi-circular or semi-elliptical shape in a section. The bottom surface of each of the groove portions 40 and 50 may be formed to be a plane parallel to the inner surface 31A of the metal layer 31, and the inner surface of each of the groove portions 40 and 50 may be formed to extend perpendicularly to the bottom surface.

In the above embodiment, the plurality of groove portions 40 and 50 are provided at predetermined intervals in the X-axis direction. However, the present invention is not limited thereto.

Figure 17:
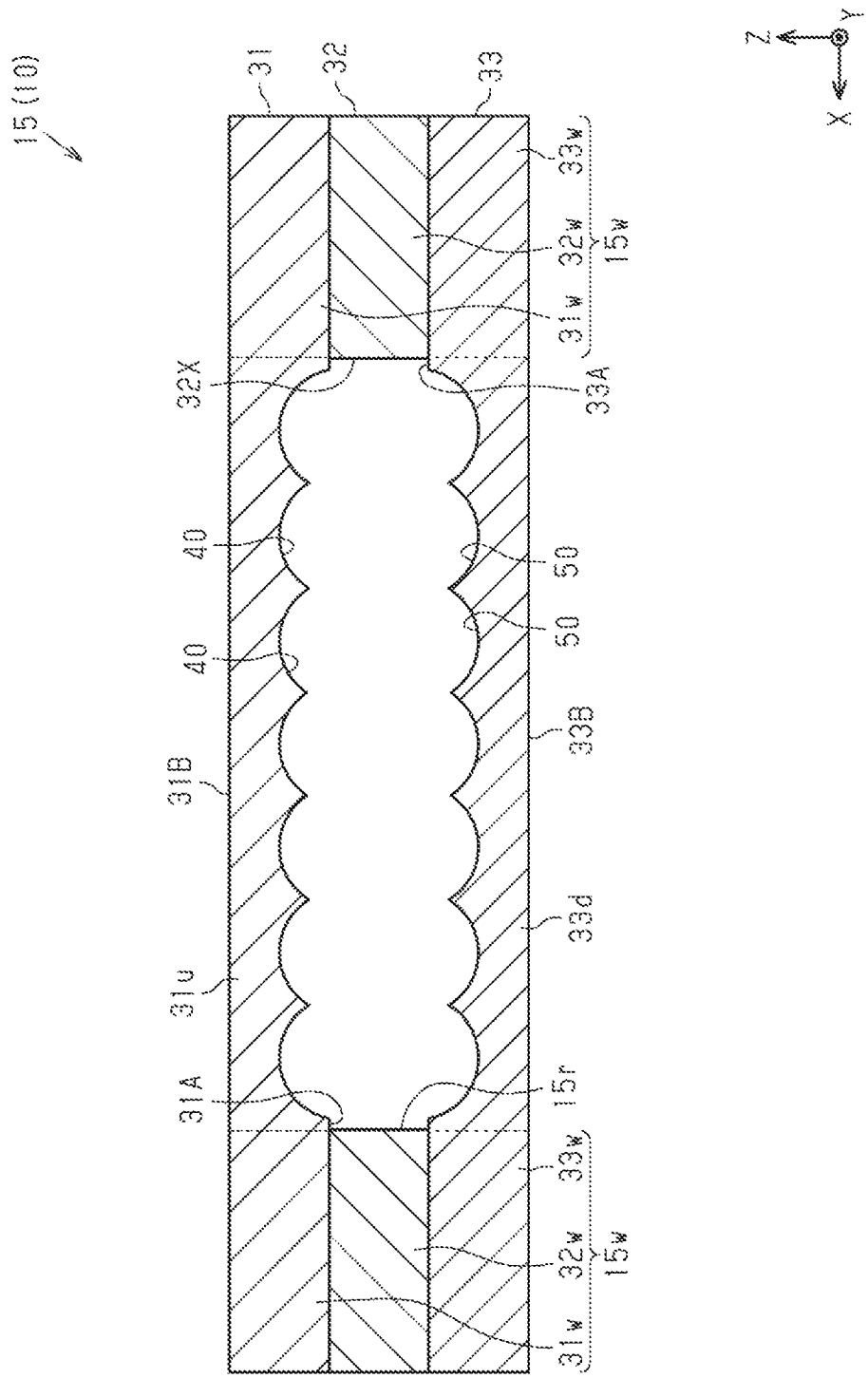
FIG. 17 is a schematic sectional view showing an injection port of a modified embodiment.

For example, as shown in FIG. 17, the plurality of groove portions 40 may be continuously formed. The plurality of groove portions 40 of this modified embodiment are continuously formed along the width direction (here, the X-axis direction) of the injection port 15. The inner surface of each groove portion 40 is formed in a concave shape having a semi-elliptical or semi-circular shape in a cross section, for example. The cross-sectional shape of the inner surface of each groove portion 40 of this modified embodiment is formed in a semi-arc shape. The cross-sectional shape of the inner surface of the plurality of groove portions 40 is formed such that the semi-arcs of the plurality of groove portions 40 are continuous along the X-axis direction.

Similarly, a plurality of groove portions 50 may be continuously formed. The plurality of groove portions 50 of this modified embodiment are continuously formed along the width direction (here, the X-axis direction) of the injection port 15. The inner surface of each groove portion 50 is formed in a concave shape having a semi-elliptical or semi-circular shape in a cross section, for example. The cross-sectional shape of the inner surface of each groove portion 50 of this modified embodiment is formed in a semi-arc shape. The cross-sectional shape of the inner surface of the plurality of groove portions 50 is formed such that the semi-arcs of the plurality of groove portions 50 are continuous along the X-axis direction. Each groove portion 50 of this modified embodiment is formed to overlap each groove portion 40 in a plan view.

Next, a manufacturing method of the loop-type heat pipe 10 of this modified embodiment will be described with reference to FIGS. 18A to 19B.

First, in a process shown in FIG. 18A, a flat plate-shaped metal sheet 91 is prepared. The metal sheet 91 is a member that finally becomes the metal layer 31 shown in FIG. 17. The metal sheet 91 is made of, for example, copper, stainless steel, aluminum, a magnesium alloy, or the like. A thickness of the metal sheet 91 may be set to about 50 μm to 200 μm, for example.

Subsequently, a resist layer 92 is formed on a lower surface of the metal sheet 91, and a resist layer 93 is formed on an upper surface of the metal sheet 91. As the resist layers 92 and 93, for example, a photosensitive dry film resist or the like may be used.

Next, in a process shown in FIG. 18B, the resist layer 92 is exposed and developed to form a plurality of opening portions 92X for selectively exposing the lower surface of the metal sheet 91. The opening portions 92X are formed to correspond to the plurality of groove portions 40 shown in FIG. 17.

Next, in a process shown in FIG. 18C, the metal sheet 91 exposed in the opening portions 92X is etched (half-etched) from the lower surface side of the metal sheet 91. Thereby, a plurality of groove portions 40 continuous along the left-right direction in the drawing are formed in the lower surface of the metal sheet 91. For etching the metal sheet 91, a ferric chloride solution may be used, for example.

Subsequently, the resist layers 92 and 93 are peeled off by a peel-off solution. Thereby, as shown in FIG. 18D, it is possible to form a metal layer 31 having a concave portion composed of an inner surface in which a plurality of semi-arcs are continuous, i.e., a plurality of groove portions 40 in the inner surface 31A.

Next, in a process shown in FIG. 19A, a metal layer 33 is formed by a method similar to the processes shown in FIGS. 18A to 18D, and a metal layer 32 is formed by a method similar to the processes shown in FIGS. 7A to 7D.

Subsequently, in a process shown in FIG. 19B, the stacked metal layers 31 to 33 are pressed while heating the same to a predetermined temperature (for example, about 900° C.), so that the metal layers 31 to 33 are joined by the solid-phase bonding. Through the above processes, the structure shown in FIG. 17 can be manufactured, and the loop-type heat pipe 10 of this modified embodiment can be manufactured.

In the loop-type heat pipe 10 of the above embodiment, the inner metal layer is configured by only the metal layer 32 of a single layer. That is, the inner metal layer is formed to have a single layer structure. However, the present invention is not limited thereto. For example, the inner metal layer may also be formed to have a stacked structure in which a plurality of metal layers is stacked. In this case, the inner metal layer is configured by a plurality of metal layers stacked between the metal layer 31 and the metal layer 33.

The injection port 15 of the above embodiment may be applied to a heat pipe having a shape other than the loop-type heat pipe 10. For example, the injection port 15 may be applied to a flat heat pipe.

The various embodiments described above are summarized as follows.

Appendix 1

A heat pipe having an injection port into which a working fluid is injected,
in which the injection port has
a first outer metal layer,
a second outer metal layer,
at least one inner metal layer provided between the first outer metal layer and the second outer metal layer, and
an injection passage in which the injected working fluid moves, the injection passage demarcated by the first outer metal layer, the second outer metal layer, and the inner metal layer,
in which the first outer metal layer has a first inner surface facing the second outer metal layer and constituting a first inner surface of the injection passage, and in which the first inner surface of the first outer metal layer has at least one first groove portion.

Appendix 2

The heat pipe according to Appendix 1, in which the second outer metal layer has a second inner surface facing the first outer metal layer and constituting a second inner surface of the injection passage, and
in which the second inner surface of the second outer metal layer has at least one second groove portion.

Appendix 3

The heat pipe according to Appendix 2, in which the second groove portion is formed not to overlap the first groove portion, in a plan view.

Appendix 4

The heat pipe according to Appendix 2, in which the second groove portion is provided to partially overlap the first groove portion, in a plan view.

Appendix 5

The heat pipe according to any one of Appendixes 1 to 4, in which the injection port includes an unsealed part and a sealed part connecting to the unsealed part, and in which the first groove portion is provided only in the unsealed part without being provided in the sealed part.

Appendix 6

The heat pipe according to any one of Appendixes 1 to 5, in which the injection port has a porous body,
in which the porous body has a first bottomed hole recessed from a first surface of the inner metal layer, a second bottomed hole recessed from a second surface of the inner metal layer, and a fine pore formed by partially communicating the first bottomed hole and the second bottomed hole with each other, and
in which the first groove portion is formed to communicate the first bottomed hole and the injection passage each other.

Appendix 7

The heat pipe according to Appendix 6, in which the inner metal layer has a through-hole penetrating through the inner metal layer in a thickness direction of the injection port, and a pair of wall portions provided on both sides of the through-hole in a width direction of the injection port,
in which the injection passage is demarcated by the pair of wall portions of the inner metal layer, the first outer metal layer, and the second outer metal layer, and
in which the porous body is provided on each of the wall portions.

Appendix 8

The heat pipe according to any one of Appendixes 1 to 7, further including:
an evaporator configured to vaporize the working fluid,
a condenser configured to condense the working fluid,
a liquid pipe configured to connect the evaporator and the condenser each other,
a vapor pipe configured to connect the evaporator and the condenser each other, and
a loop-shaped flow passage through which the working fluid flows,
in which the injection passage is provided to communicate with the flow passage.

Appendix 9

The heat pipe according to Appendix 8, in which the injection port is connected to the liquid pipe,
in which the liquid pipe has a porous part, and
in which the first groove portion is configured to extend toward the liquid pipe and is spaced apart from the porous part of the liquid pipe.

Appendix 10

The heat pipe according to any one of Appendixes 1 to 9, in which the first outer metal layer has a plurality of first groove portions, and
in which the plurality of first groove portions are formed continuously with each other in a width direction of the injection port.

What is claimed is:

1. A heat pipe comprising:
an evaporator configured to vaporize a working fluid;
a condenser configured to condense the working fluid;
a liquid pipe configured to connect the evaporator and the condenser to each other;
a vapor pipe configured to connect the evaporator and the condenser to each other;
a loop-shaped flow passage through which the working fluid flows; and
an injection port being an inlet into which the working fluid is injected into the loop-shaped flow passage, wherein the injection port has a length direction extending to the flow passage and a width direction orthogonal to the length direction, the injection port has:
a first outer metal layer,
a second outer metal layer,
at least one inner metal layer provided between the first outer metal layer and the second outer metal layer, and
an injection passage in which the injected working fluid moves, the injection passage demarcated by the first outer metal layer, the second outer metal layer, and the inner metal layer,
wherein the first outer metal layer has a first inner surface facing the second outer metal layer and constituting a first inner surface of the injection passage, and
wherein the first inner surface of the first outer metal layer has a plurality of first groove portions extending along the length direction of the injection port, each of the plurality of first groove portions being formed to be concave from the first inner surface of the first outer metal layer in a thickness direction of the first outer metal layer,
wherein the second outer metal layer has a second inner surface facing the first outer metal layer and constituting a second inner surface of the injection passage, and
wherein the second inner surface of the second outer metal layer has a plurality of second groove portions extending along the length direction of the injection port, each of the plurality of second groove portions being formed to be concave from the second inner surface of the second outer metal layer in a thickness direction of the second outer metal layer, and
wherein each of the plurality of second groove portions is formed not to overlap any of the plurality of first groove portions, in a plan view.

2. The heat pipe according to claim 1, wherein the injection port has an unsealed part and a sealed part connected to the unsealed part, and
wherein the plurality of first groove portions are provided only in the unsealed part without being provided in the sealed part.

3. The heat pipe according to claim 1, wherein the injection port comprises a porous body,
wherein the porous body has a first bottomed hole recessed from a first surface of the inner metal layer, a second bottomed hole recessed from a second surface of the inner metal layer, and a fine pore formed by partially communicating the first bottomed hole and the second bottomed hole each other, and
wherein the plurality of first groove portions are formed to communicate the first bottomed hole and the injection passage with each other.

4. The heat pipe according to claim 3, wherein the inner metal layer has a through-hole penetrating through the inner metal layer in a thickness direction of the injection port, and a pair of wall portions provided on both sides of the through-hole in a width direction of the injection port,
wherein the injection passage is demarcated by the pair of wall portions of the inner metal layer, the first outer metal layer, and the second outer metal layer, and
wherein the porous body is provided on each of the wall portions.

5. The heat pipe according to claim 1, wherein the injection port is connected to the liquid pipe,
wherein the liquid pipe has a porous part, and
wherein the plurality of first groove portions are configured to extend along the length direction of the injection port toward the liquid pipe and are spaced apart from the porous part of the liquid pipe.

6. The heat pipe according to claim 1,
wherein the plurality of first groove portions are formed continuously with each other in a width direction of the injection port.

* * * * *